US00RE46949E

(19) United States
(12) Reissued Patent
Maeda et al.

(10) Patent Number: US RE46,949 E
(45) Date of Reissued Patent: Jul. 10, 2018

(54) NON-VOLATILE SEMICONDUCTOR STORAGE DEVICE

(71) Applicant: TOSHIBA MEMORY CORPORATION, Minato-ku (JP)

(72) Inventors: Takashi Maeda, Yokohama (JP); Yoshihisa Iwata, Yokohama (JP)

(73) Assignee: TOSHIBA MEMORY CORPORATION, Minato-ku (JP)

(21) Appl. No.: 14/961,516

(22) Filed: Dec. 7, 2015

Related U.S. Patent Documents

Reissue of:
(64) Patent No.: 7,933,151
Issued: Apr. 26, 2011
Appl. No.: 12/564,576
Filed: Sep. 22, 2009

U.S. Applications:
(60) Continuation of application No. 14/026,844, filed on Sep. 13, 2013, now Pat. No. Re. 45,832, and a
(Continued)

(30) Foreign Application Priority Data

Nov. 14, 2008 (JP) ..... 2008-291779

(51) Int. Cl.
*G11C 16/00* (2006.01)
*G11C 16/04* (2006.01)
(Continued)

(52) U.S. Cl.
CPC ..... *G11C 16/0483* (2013.01); *G11C 5/02* (2013.01); *G11C 7/18* (2013.01); *G11C 16/10* (2013.01);
(Continued)

(58) Field of Classification Search
CPC ..... G11C 5/02; G11C 7/18; G11C 16/0483; G11C 16/10; G11C 16/14; H01L 27/11565; H01L 27/11578; H01L 27/11582
(Continued)

(56) References Cited

U.S. PATENT DOCUMENTS 4,959,812 A 9/1990 Momodomi et al.
5,511,022 A * 4/1996 Yim ..... G11C 16/0483 365/185.17
(Continued)

FOREIGN PATENT DOCUMENTS

JP 2007-266143 10/2007
JP 2008-171918 A 7/2008
(Continued)

OTHER PUBLICATIONS

Office Action issued Apr. 2, 2013 in Japanese Patent Application No. 2008-291779 (with English language translation).
(Continued)

*Primary Examiner* — Ovidio Escalante
(74) *Attorney, Agent, or Firm* — Oblon, McClelland, Maier & Neustadt, L.L.P.

(57) ABSTRACT

Memory strings includes: a first semiconductor layer including a columnar portion extending in a direction perpendicular to a substrate; a first electric charge storage layer formed to surround a side surface of the columnar portion; and a first conductive layer formed to surround the first electric charge storage layer. First selection transistors includes: a second semiconductor layer extending upward from a top surface of the columnar portion; a second electric charge storage layer formed to surround a side surface of the second semiconductor layer; and a second conductive layer formed to surround the second electric charge storage layer. The non-volatile semiconductor storage device further includes a control circuit that causes, prior to reading data from a selected one of the memory strings, electric charges to be accumulated in the second electric charge storage layer of one of the first selection transistors connected to an unselected one of the memory strings.

14 Claims, 21 Drawing Sheets

Related U.S. Application Data division of application No. 13/870,676, filed on Apr. 25, 2013, which is an application for the reissue of Pat. No. 7,933,151.

(51) Int. Cl.

| | |
|---|---|
| ***G11C 7/18*** | (2006.01) |
| ***G11C 16/14*** | (2006.01) |
| ***H01L 27/11565*** | (2017.01) |
| ***H01L 27/11578*** | (2017.01) |
| ***H01L 27/11582*** | (2017.01) |
| ***G11C 5/02*** | (2006.01) |
| ***G11C 16/10*** | (2006.01) |

(52) U.S. Cl.
CPC ..... *G11C 16/14* (2013.01); *H01L 27/11565* (2013.01); *H01L 27/11578* (2013.01); *H01L 27/11582* (2013.01)

(58) Field of Classification Search
USPC ..... 365/185.11, 185.17
See application file for complete search history.

(56) References Cited

U.S. PATENT DOCUMENTS

| | | | | |
|---|---|---|---|---|
| 5,599,724 | A | 2/1997 | Yoshida | |
| 5,707,885 | A | 1/1998 | Lim | |
| 6,285,587 | B1 | 9/2001 | Kwon | |
| 6,295,227 | B1 | 9/2001 | Sakui et al. | |
| 6,411,548 | B1 | 6/2002 | Sakui et al. | |
| 7,054,195 | B2 | 5/2006 | Matsunaga | |
| 7,619,927 | B2 * | 11/2009 | Cho | 365/185.17 |
| 7,683,404 | B2 * | 3/2010 | Jang et al. | 257/211 |
| 7,821,058 | B2 | 10/2010 | Kidoh et al. | |
| 7,847,334 | B2 * | 12/2010 | Katsumata et al. | 257/315 |
| 7,990,771 | B2 | 8/2011 | Hwang et al. | |
| 8,134,873 | B2 | 3/2012 | Choi et al. | |
| 8,238,164 | B2 | 8/2012 | Kim et al. | |
| 2007/0252201 | A1 | 11/2007 | Kito et al. | |
| 2008/0067573 | A1 | 3/2008 | Jang et al. | |
| 2008/0180994 | A1 | 7/2008 | Katsumata et al. | |
| 2008/0192548 | A1 * | 8/2008 | Shibata | G11C 11/5628 365/185.17 |
| 2008/0239814 | A1 | 10/2008 | Cho | |

FOREIGN PATENT DOCUMENTS

| | | |
|---|---|---|
| JP | 2009-146942 | 7/2009 |
| WO | 2009/075370 | 6/2009 |
| WO | WO 2009/075370 A1 | 6/2009 |
| WO | 2013/086277 A2 | 6/2013 |

OTHER PUBLICATIONS

Taiwanese Office Action issued Nov. 30, 2015 in Taiwan application No. 102133035 with English translation, 4 pages.

U.S. Appl. No. 12/684,349, filed Jan. 8, 2010, Itagaki et al.

U.S. Appl. No. 12/679,991, filed Mar. 25, 2010, Fukuzumi et al.

H. Tanaka, et al., "Bit Cost Scalable Technology with Punch and Plug Process for Ultra High Density Flash Memory", IEEE Symposium on VLSI Technology Digest of Technical Papers, 2007, pp. 14-15.

Yoshiaki Fukuzumi, et al., "Optimal Integration and Characteristics of Vertical Array Devices for Ultra-High Density, Bit-Cost Scalable Flash Memory", IEEE International Electron Devices Meeting, 2007, pp. 449-452.

* cited by examiner

NON-VOLATILE SEMICONDUCTOR STORAGE DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*More than one reissue application has been filed for the reissue of U.S. Pat. No. 7,933,151. The reissue applications are application Ser. No. 13/870,676 (grandparent application), application Ser. No. 14/026,844 (parent application and divisional of Ser. No. 13/870,676), and the present continuation application. The present application claims benefit of priority under 35 U.S.C. § 120 of application Ser. No. 14/026,844.*

CROSS-REFERENCE TO RELATED APPLICATIONS

This application is based upon and claims the benefit of priority from the prior Japanese Patent Application No. 2008-291779, filed on Nov. 14, 2008, the entire contents of which are incorporated herein by reference.

BACKGROUND OF THE INVENTION

1. Field of the Invention

The present invention relates to an electrically rewritable non-volatile semiconductor storage device.

2. Description of the Related Art

Conventionally, LSIs are formed by integration of devices in a two-dimensional plane on the silicon substrate. Although the dimension for each device must be reduced (refined) to increase memory storage capacity, recent years are facing challenges in such refinement from the viewpoint of cost and technology. Such refinement requires further improvements in photolithography technology. However, in currently available ArF immersion lithography technology, for example, the resolution limit has been reached around the 40 nm design rule and so EUV exposure devices have to be introduced for further refinement. However, the EUV exposure devices are expensive and infeasible in view of the costs. In addition, if such refinement is accomplished, it is assumed that physical improvement limit, such as in breakdown voltage between devices, would be reached unless driving voltage can be scaled. That is, it is likely that difficulties would be encountered in device operation itself.

Therefore, a large number of semiconductor storage devices have been proposed recently where memory cells are arranged in a three-dimensional manner to achieve improved integration of memory devices (see, Patent Document 1: Japanese Patent Laid-Open No. 2007-266143; Patent Document 2: U.S. Pat. No. 5,599,724; and Patent Document 3: U.S. Pat. No. 5,707,885).

One of the conventional semiconductor storage devices where memory cells are arranged in a three-dimensional manner uses transistors with a cylinder-type structure (see, Patent Documents 1 to 3). Those semiconductor storage devices using transistors with the cylinder-type structure are provided with multiple laminated conductive layers corresponding to gate electrodes and pillar-like columnar semiconductors. Each of the columnar semiconductors serves as a channel (body) part of each of the transistors. Memory gate insulation layers that can accumulate electric charges are provided around the columnar semiconductors. Such a configuration including laminated conductive layers, columnar semiconductors, and memory gate insulation layers is referred to as a "memory string".

Regarding the semiconductor storage devices with the above-mentioned memory strings, there is a need for reading data from a selected memory string in a more precise manner.

SUMMARY OF THE INVENTION

One aspect of the present invention provides a non-volatile semiconductor storage device comprising: a plurality of memory strings, each having a plurality of electrically rewritable memory cells connected in series; and a plurality of first selection transistors connected to one ends of the respective memory strings, each of the memory strings comprising: a first semiconductor layer including a columnar portion extending in a direction perpendicular to a substrate; a first electric charge storage layer formed to surround a side surface of the columnar portion; and a first conductive layer formed to surround a side surface of the columnar portion as well as the first electric charge storage layer, the first conductive layer functioning as a control electrode of a respective one of the memory cells, each of the first selection transistors comprising: a second semiconductor layer extending upward from a top surface of the columnar portion; a second electric charge storage layer formed to surround a side surface of the second semiconductor layer; and a second conductive layer formed to surround a side surface of the second semiconductor layer as well as the second electric charge storage layer, the second conductive layer functioning as a control electrode of a respective one of the first selection transistors, the non-volatile semiconductor storage device further comprising a control circuit configured to cause, prior to reading data from a selected one of the memory strings, electric charges to be accumulated in the second electric charge storage layer of one of the first selection transistors connected to an unselected one of the memory strings.

Another aspect of the present invention provides a non-volatile semiconductor storage device comprising: a plurality of memory strings, each having a plurality of electrically rewritable memory cells connected in series; and a plurality of first selection transistors connected to one ends of the respective memory strings, each of the memory strings comprising: a first semiconductor layer including a columnar portion extending in a direction perpendicular to a substrate; a first electric charge storage layer formed to surround a side surface of the columnar portion; and a first conductive layer formed to surround a side surface of the columnar portion as well as the first electric charge storage layer, the first conductive layer functioning as a control electrode of a respective one of the memory cells, each of the first selection transistors comprising: a second semiconductor layer extending downward from a bottom surface of the columnar portion; a second electric charge storage layer formed to surround a side surface of the second semiconductor layer; and a second conductive layer formed to surround a side surface of the second semiconductor layer as well as the second electric charge storage layer, the second conductive layer functioning as a control electrode of a respective one of the first selection transistors, the non-volatile semiconductor storage device further comprising a control circuit configured to cause, prior to reading data from a selected one of the memory strings, electric charges to be accumulated in the second electric charge storage layer of one of the first selection transistors connected to an unselected one of the memory strings.

DETAILED DESCRIPTION OF THE EMBODIMENTS

Embodiments of anon-volatile semiconductor storage device according to the present invention will now be described below with reference to the accompanying drawings.

First Embodiment

Figure 1:
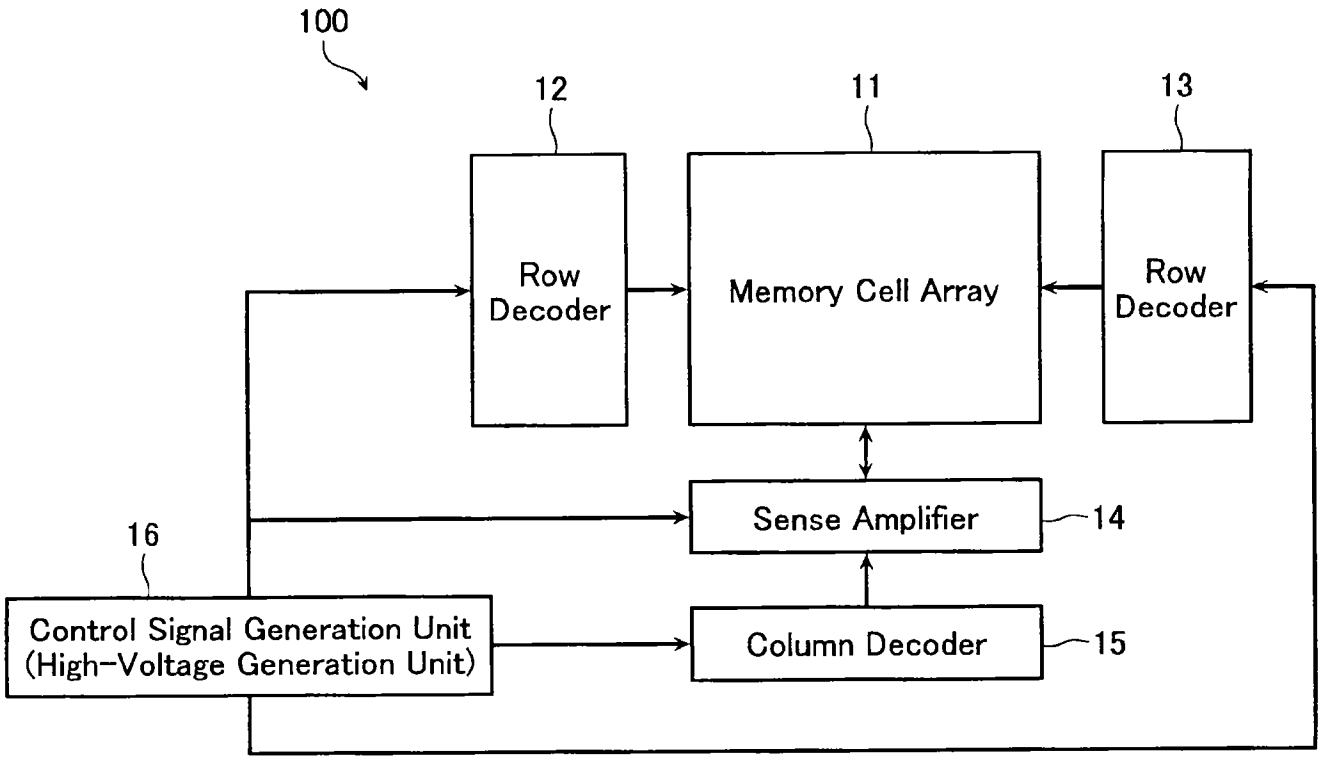
FIG. 1 is a block diagram of a non-volatile semiconductor storage device 100 according to a first embodiment of the present invention.

Configuration of Non-Volatile Semiconductor Storage Device 100 in First Embodiment Referring first to FIG. 1, a configuration of a non-volatile semiconductor storage device 100 according to a first embodiment will be described below. FIG. 1 is a block diagram of the non-volatile semiconductor storage device 100 according to the first embodiment of the present invention.

As illustrated in FIG. 1, the non-volatile semiconductor storage device 100 of the first embodiment comprises: a memory cell array 11; row decoders 12 and 13; a sense amplifier 14; a column decoder 15; and a control signal generation unit (high-voltage generation unit) 16.

The memory cell array 11 has memory transistors MTr for electrically storing data. The row decoders 12 and 13 decode captured block address signals and gate address signals. The row decoders 12 and 13 also control the memory cell array 11. The sense amplifier 14 reads data from the memory cell array 11. The column decoder 15 decodes column address signals and controls the sense amplifier 14. The control signal generation unit 16 boosts a reference voltage to generate a high voltage that is required at the time of write and erase operations. Furthermore, The control signal generation unit 16 generates a control signal to control the row decoders 12 and 13, the sense amplifier 14, and the column decoder 15.

Figure 2:
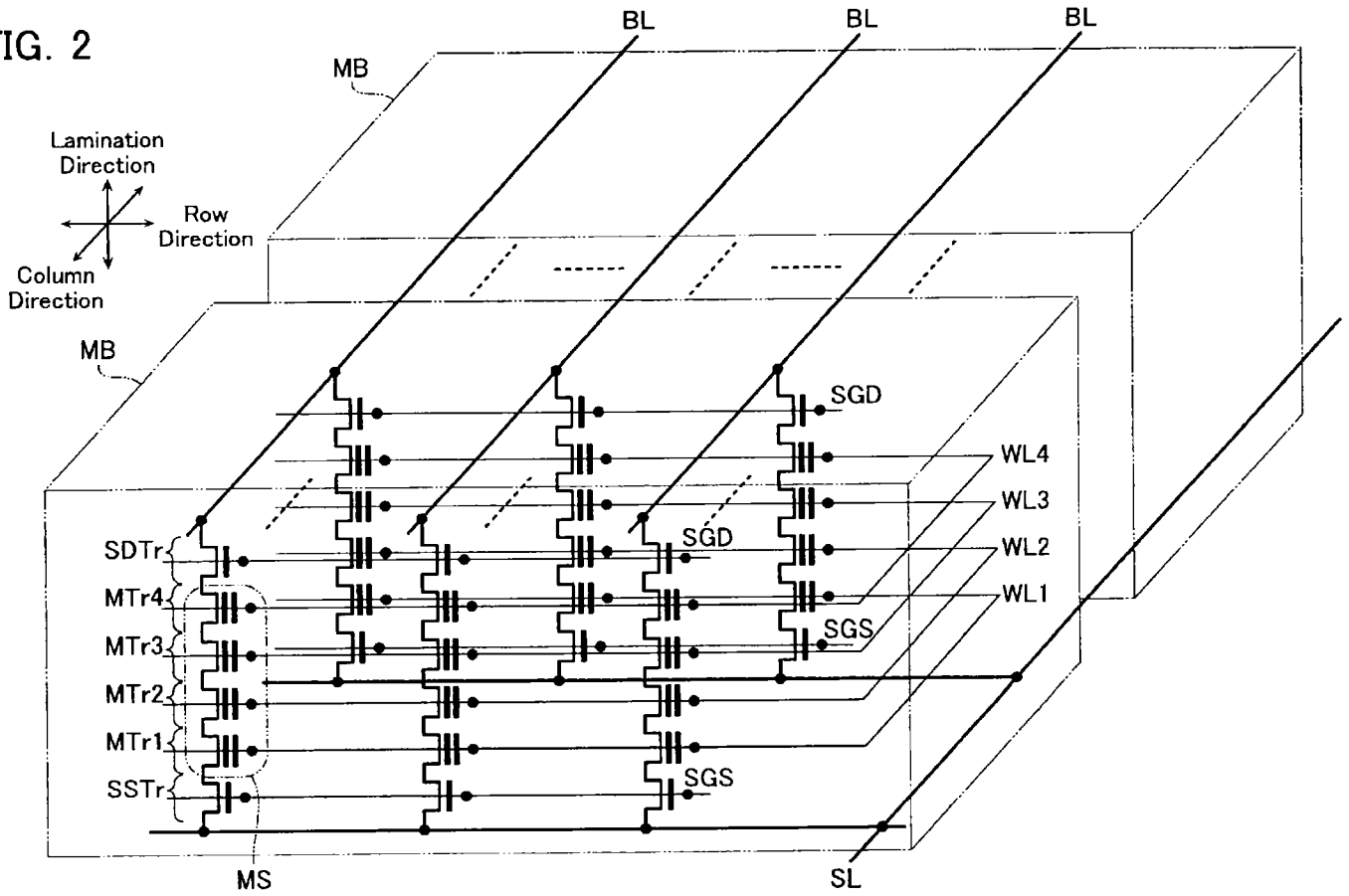
FIG. 2 is a schematic perspective view of a memory cell array 11.
Figure 3:
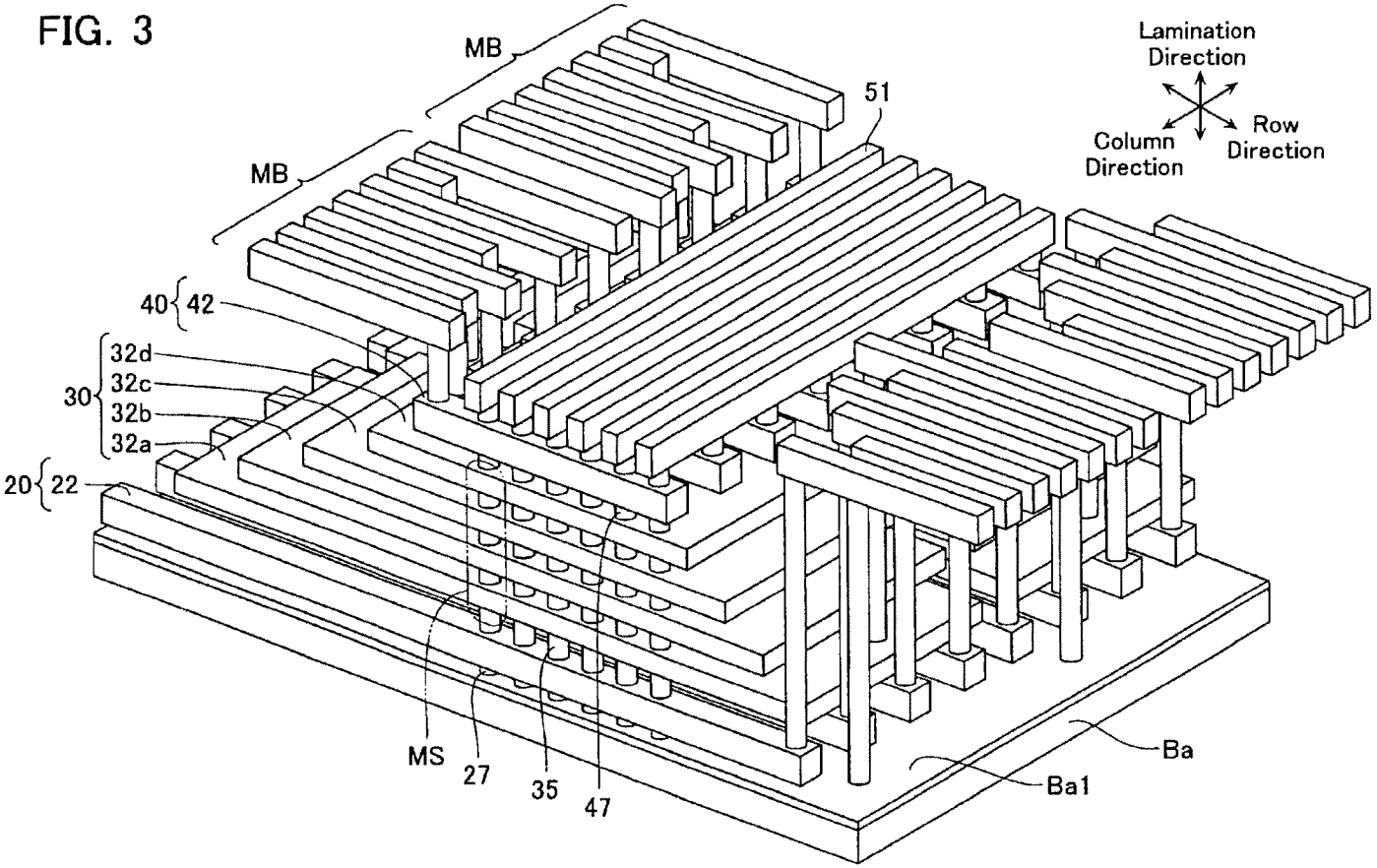
FIG. 3 is an enlarged view of FIG. 2.
Figure 4:
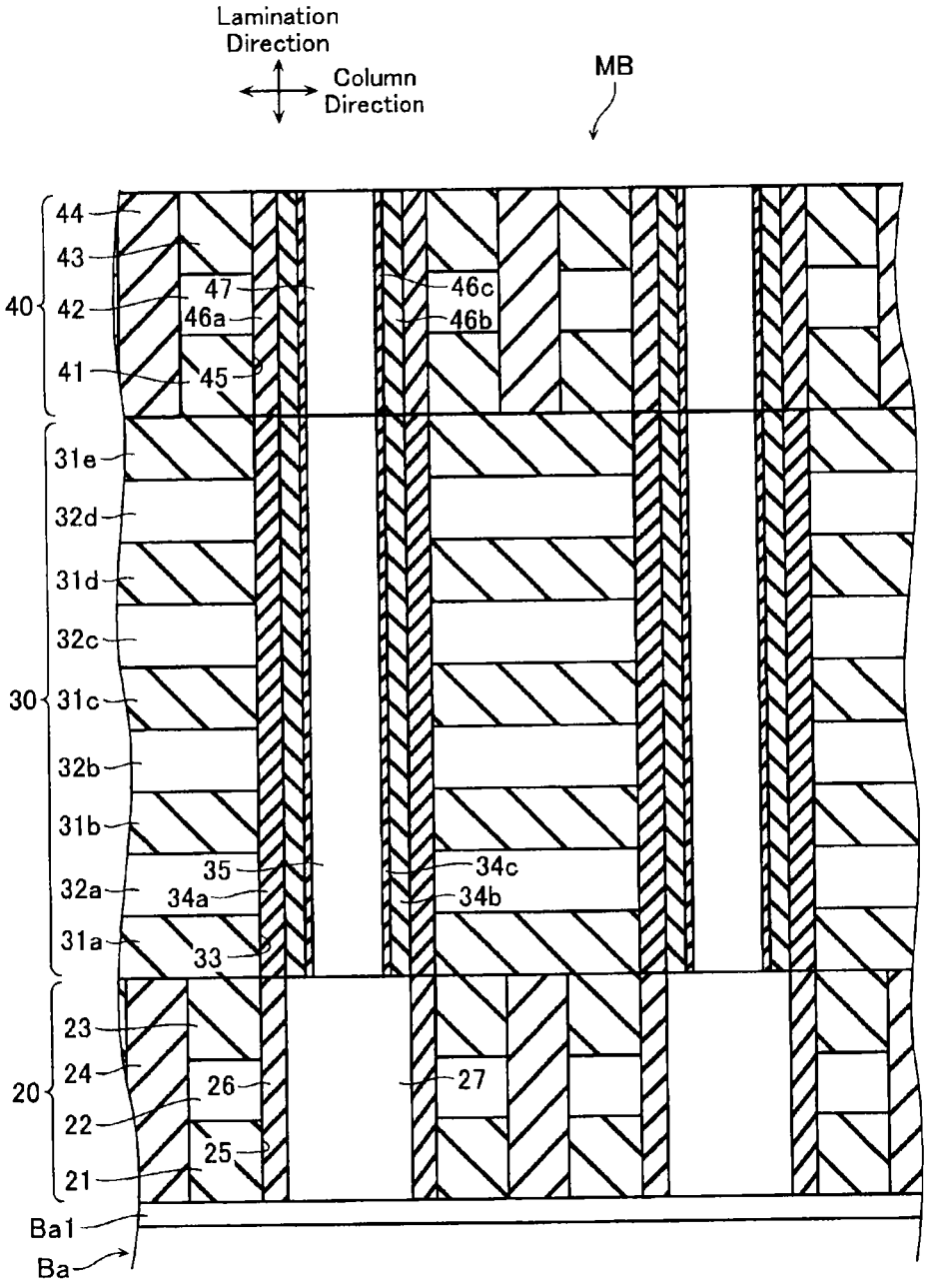
FIG. 4 is a cross-sectional view of FIG. 3.

Referring now to FIGS. 2 to 4, a lamination structure and a circuit configuration of the memory cell array 11 will be described below. FIG. 2 is a schematic perspective view of a memory cell array 11. FIG. 3 is an enlarged view of FIG. 2. FIG. 4 is a cross-sectional view of FIG. 3. Wherein, the row direction represents a direction orthogonal to the lamination direction and the column direction represents another orthogonal to the lamination direction and the row direction. Note that interlayer insulation layers provided between wirings are omitted from FIG. 3.

As illustrated in FIG. 2, the memory cell array 11 has a plurality of memory blocks MB. The memory blocks MB are arranged in the column direction on a semiconductor substrate Ba (not illustrated). In other words, one memory block MB is formed for each certain region on the semiconductor substrate Ba.

As illustrated in FIG. 2, each memory block MB comprises a plurality of memory strings MS, source-side selection transistors SSTr, and drain-side selection transistors SDTr. Each memory string MS includes memory transistors MTr1 to MTr4 connected in series. Each drain-side selection transistor SDTr is connected to one end (a memory transistor MTr4) of a respective memory string MS. Each source-side selection transistor SSTr is connected to the other end (a memory transistor MTr1) of a respective memory string MS. For example, each memory block MB has multiple rows and four columns of memory strings MS provided therein. Note that each memory string MS may include four or more memory transistors. In addition, four or more columns of memory strings MS may be provided in each memory block MB.

As illustrated in FIG. 2, in each memory block MB, the control gates of the memory transistors MTr1 arranged in a matrix form are commonly connected to a word line WL1. Similarly, the control gates of the memory transistors MTr2 are commonly connected to a word line WL2. The control gates of the memory transistors MTr3 are commonly connected to a word line WL3. The control gates of the memory transistors MTr4 are commonly connected to a word line WL4. The word lines WL1 to WL4 are controlled by independent signals.

As illustrated in FIG. 2, in each memory block MB, the control gates of the drain-side selection transistors SDTr arranged in the row direction are commonly connected to a drain-side selection gate line SGD. Each drain-side selection gate line SGD is formed to extend in the row direction across a plurality of memory blocks MB. A plurality of drain-side selection gate lines SGD, which are provided in the column direction, are controlled by independent signals. In addition, the other ends of the drain-side selection transistors SDTr arranged in the column direction are commonly connected to a bit line BL. Each bit line BL is formed to extend in the column direction across the memory blocks MB. A plurality of bit lines BL, which are provided in the row direction, are controlled by independent signals.

As illustrated in FIG. 2, in each memory block MB, the control gates of the source-side selection transistors SSTr arranged in the row direction are commonly connected to a source-side selection gate line SGS. Each source-side selection gate line SGS is formed to extend in the row direction across a plurality of memory blocks MB. A plurality of source-side selection gate lines SGS, which are provided in the column direction, are controlled by independent signals. In addition, the other ends of the source-side selection transistors SSTr arranged in the column direction are commonly connected to a source line SL.

The circuit configuration of the memory blocks MB as described above is achieved by the lamination structure illustrated in FIGS. 3 and 4. Each memory block MB has a source-side selection transistor layer 20, a memory transistor layer 30, and a drain-side selection transistor layer 40 that are sequentially laminated on the semiconductor substrate Ba.

The source-side selection transistor layer 20 is a layer that functions as source-side selection transistors SSTr. The memory transistor layer 30 is a layer that functions as memory strings MS (memory transistors MTr1 to MTr4). The drain-side selection transistor layer 40 is a layer that functions as drain-side selection transistors SDTr.

As illustrated in FIGS. 3 and 4, the source-side selection transistor layer 20 has source-side first insulation layers 21, source-side conductive layers 22, and source-side second insulation layers 23 that are sequentially formed on the semiconductor substrate Ba. Each source-side conductive layer 22 is formed to extend in the row direction. Note that an interlayer insulation layer 24 is formed on the sidewall of each source-side conductive layer 22.

The source-side first insulation layers 21 and the source-side second insulation layers 23 are composed of, e.g., silicon oxide ($SiO_2$) or silicon nitride (SiN). The source-side conductive layers 22 are composed of, e.g., polysilicon (p-Si).

As illustrated in FIG. 4, the source-side selection transistor layer 20 also has source-side holes 25 that are formed to penetrate the source-side first insulation layers 21, the source-side conductive layers 22, and the source-side second insulation layers 23. The source-side holes 25 are formed in a matrix form in the row and column directions.

Furthermore, as illustrated in FIG. 4, the source-side selection transistor layer 20 has source-side gate insulation layers 26 and source-side columnar semiconductor layers 27 that are sequentially formed on the sidewalls of the source-side holes 25. The source-side gate insulation layers 26 are formed with a certain thickness on the sidewalls of the source-side holes 25. The source-side columnar semiconductor layers 27 are formed to fill up the source-side holes 25. Each source-side columnar semiconductor layer 27 is formed in a columnar shape extending in the lamination direction. The top surfaces of the source-side columnar semiconductor layers 27 are formed in contact with the bottom surfaces of respective memory columnar semiconductor layers 35 described below. The source-side columnar semiconductor layers 27 are formed on a diffusion layer Ba1 on the semiconductor substrate Ba. The diffusion layer Ba1 functions as a source line SL.

The source-side gate insulation layers 26 are composed of, e.g., silicon oxide ($SiO_2$). The source-side columnar semiconductor layers 27 are composed of, e.g., polysilicon (p-Si).

According to the configuration of the source-side selection transistor layer 20 as mentioned above, the source-side conductive layers 22 function as the control gates of the source-side selection transistors SSTr. The source-side conductive layers 22 also function as source-side selection gate lines SGS.

As illustrated in FIGS. 3 and 4, the memory transistor layer 30 has first to fifth insulation layers between word lines 31a to 31e and first to fourth word-line conductive layers 32a to 32d that are sequentially laminated on the source-side selection transistor layer 20. The first to fourth word-line conductive layers 32a to 32d are formed to expand in a two-dimensional manner (in a plate-like form) in the row and column directions. The first to fourth word-line conductive layers 32a to 32d are separated for each memory block MB.

The first to fifth insulation layers between word lines 31a to 31e are composed of, e.g., silicon oxide ($SiO_2$). The first to fourth word-line conductive layers 32a to 32d are composed of, e.g., polysilicon (p-Si).

As illustrated in FIG. 4, the memory transistor layer 30 also has memory holes 33 that are formed to penetrate the first to fifth insulation layers between word lines 31a to 31e and the first to fourth word-line conductive layers 32a to 32d. The memory holes 33 are formed in a matrix form in the row and column directions. The memory holes 33 are formed at positions matching the source-side holes 25.

Furthermore, as illustrated in FIG. 4, the memory transistor layer 30 has block insulation layers 34a, electric charge storage layers 34b, tunnel insulation layers 34c, and memory columnar semiconductor layers 35 that are sequentially formed on the sidewalls of the memory holes 33. The block insulation layers 34a are formed with a certain thickness on the sidewalls of the memory holes 33. The electric charge storage layers 34b are formed with a certain thickness on the sidewalls of the block insulation layers 34a. The tunnel insulation layers 34c are formed with a certain thickness on the sidewalls of the electric charge storage layers 34b. The memory columnar semiconductor layers 35 are formed to fill up the memory holes 33. Each memory columnar semiconductor layer 35 is formed in a columnar shape extending in the lamination direction. The bottom surfaces of the memory columnar semiconductor layers 35 are formed in contact with the top surfaces of the respective source-side columnar semiconductor layers 27. In addition, the top surfaces of the memory columnar semiconductor layers 35 are formed in contact with the bottom surfaces of respective drain-side columnar semiconductor layers 47 described below.

The block insulation layers 34a and the tunnel insulation layers 34c are composed of, e.g., silicon oxide ($SiO_2$). The electric charge storage layers 34b are composed of, e.g., silicon nitride (SiN). The memory columnar semiconductor layers 35 are composed of, e.g., polysilicon (p-Si).

In the configuration of the memory transistor layer 30 as mentioned above, the first to fourth word-line conductive layers 32a to 32d function as the control gates of the memory transistors MTr1 to MTr4. The first to fourth word-line conductive layers 32a to 32d also function as parts of the word lines WL1 to WL4.

As illustrated in FIGS. 3 and 4, the drain-side selection transistor layer 40 has drain-side first insulation layers 41, drain-side conductive layers 42, and drain-side second insulation layers 43 that are sequentially laminated on the memory transistor layer 30. The drain-side conductive layers are formed immediately above where the memory columnar semiconductor layers 35 are formed. The drain-side conductive layers 42 are formed to extend in the row direction. Note that interlayer insulation layers 44 are formed on the sidewalls of the drain-side conductive layers 42.

The drain-side first insulation layers 41 and the drain-side second insulation layers 43 are composed of, e.g., silicon oxide ($SiO_2$) or silicon nitride (SiN). The drain-side conductive layers 42 are composed of, e.g., polysilicon (p-Si).

As illustrated in FIG. 4, the drain-side selection transistor layer 40 also has drain-side holes 45 that are formed to penetrate the drain-side first insulation layers 41, the drain-side conductive layers 42, and the drain-side second insulation layers 43. The drain-side holes 45 are formed in a matrix form in the row and column directions. The drain-side holes 45 are formed at positions matching the memory holes 33.

Furthermore, as illustrated in FIG. 4, the drain-side selection transistor layer 40 has block insulation layers 46a, electric charge storage layers 46b, tunnel insulation layers 46c, and the drain-side columnar semiconductor layers 47 that are sequentially formed on the sidewalls of the drain-side holes 45. The block insulation layers 46a are formed with a certain thickness on the sidewalls of the drain-side holes 45. The electric charge storage layers 46b are formed with a certain thickness on the sidewalls of the block insulation layers 46a. The tunnel insulation layers 46c are formed with a certain thickness on the sidewalls of the electric charge storage layers 46b. The drain-side columnar semiconductor layers 47 are formed to fill up the drain-side holes 45. Each drain-side columnar semiconductor layer 47 is formed in a columnar shape extending in the lamination direction. The bottom surfaces of the drain-side columnar semiconductor layers 47 are formed in contact with the top surfaces of the memory columnar semiconductor layers 35. Bit line layers 51 are formed on the top surfaces of the drain-side columnar semiconductor layers 47. The bit line layers 51 are formed to extend in the column direction at a certain pitch in the row direction. The bit line layers 51 function as bit lines BL.

The block insulation layers 46a and the tunnel insulation layers 46c are composed of, e.g., silicon oxide ($SiO_2$). The electric charge storage layers 46b are composed of, e.g., silicon nitride (SiN). The drain-side columnar semiconductor layers 47 are composed of, e.g., polysilicon (p-Si).

In the configuration of the drain-side selection transistor layer 40 as mentioned above, the drain-side conductive layers 42 function as the control gates of the drain-side selection transistors SDTr. The drain-side conductive layers 42 also function as parts of drain-side selection gate lines SGD.

Figure 5:
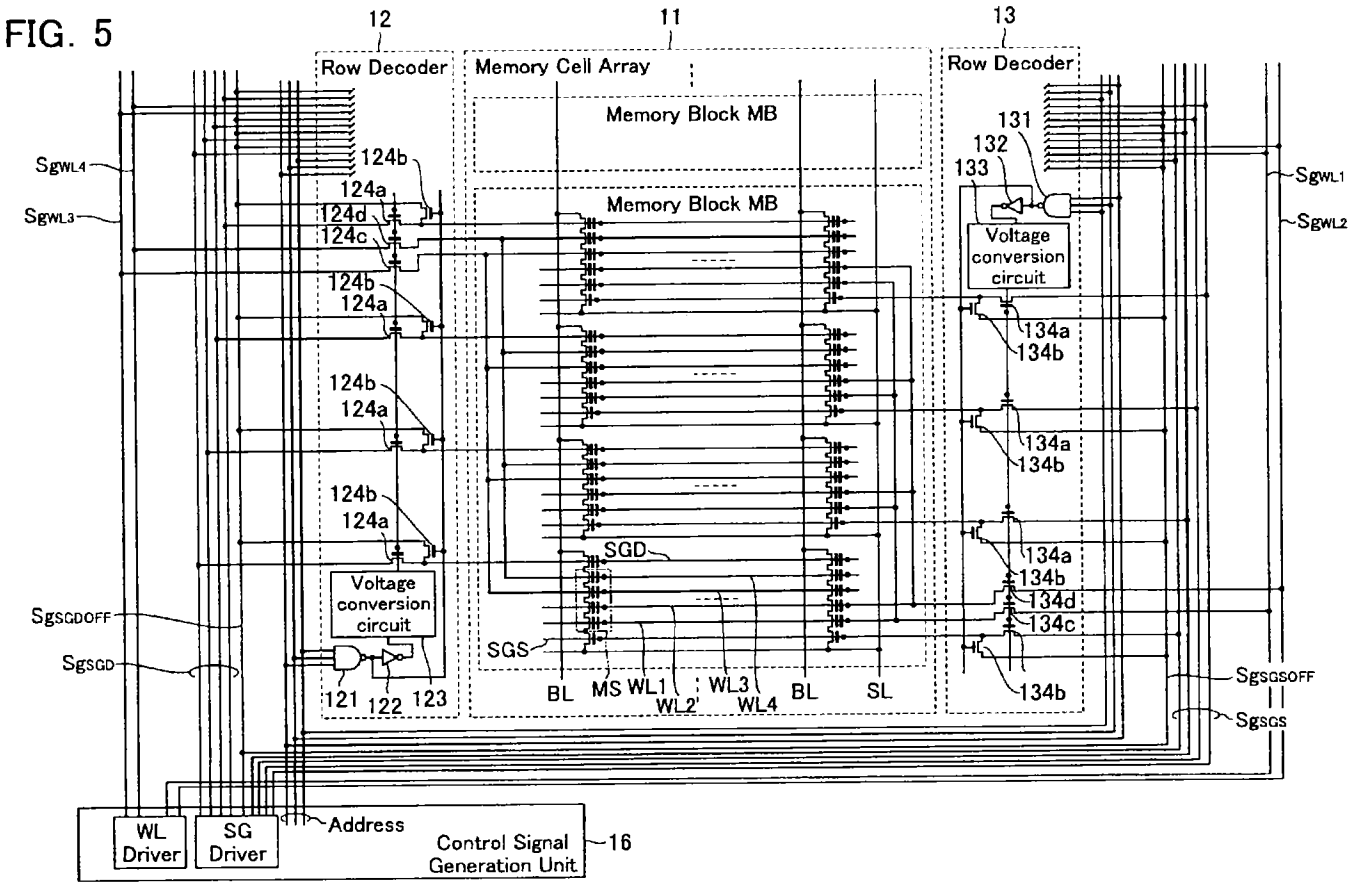
FIG. 5 is a circuit diagram of the non-volatile semiconductor storage device 100.

Referring now to FIG. 5, a circuit configuration of the row decoders 12 and 13 will be described below. FIG. 5 is a circuit diagram of the non-volatile semiconductor storage device 100.

As illustrated in FIG. 5, a row decoder 12 has a NAND circuit 121, a NOT circuit 122, and a voltage conversion circuit 123 for each memory block MB.

Each NAND circuit 121 receives an address signal Address from the control signal generation unit 16 and outputs it to the NOT circuit 122. The NOT circuit 122 receives the signal from the NAND circuit 121 and outputs it to the voltage conversion circuit 123. The voltage conversion circuit 123 converts the voltage of the signal received from the NOT circuit 122, and then outputs the converted signal to a control gate of a first transfer transistor 124a described below.

As illustrated in FIG. 5, the row decoder 12 also has a pair of first and second transfer transistors 124a and 124b for memory strings MS connected to the same drain-side selection gate line SGD.

One end of the first transfer transistor 124a receives a signal $Sg_{SGD}$ from the control signal generation unit 16. The signal $Sg_{SGD}$ is a signal for driving a particular drain-side selection gate line SGD. The other end of each first transfer transistor 124a is connected to a drain-side selection gate line SGD. The control gate of each first transfer transistor 124a receives a signal from the voltage conversion circuit 123.

One end of each second transfer transistor 124b receives a signal $Sg_{SGDOFF}$ from the control signal generation unit 16. The signal $Sg_{SGDOFF}$ is a signal for disabling a drain-side selection gate line SGD. The other end of each second transfer transistor 124b is connected to a drain-side selection gate line SGD. The control gate of each second transfer transistor 124b receives a signal from the NAND circuit 121.

As illustrated in FIG. 5, the row decoder 12 also has third and fourth transfer transistors 124c and 124d for each memory block MB.

One ends of the third and fourth transfer transistors 124c and 124d receive signals $Sg_{WL3}$ and $Sg_{WL4}$, respectively, from the control signal generation unit 16. The signals $Sg_{WL3}$ and $Sg_{WL4}$ are signals for driving the word lines WL3 and WL4. The other ends of the third and fourth transfer transistors 124c and 124d are connected to the word lines WL3 and WL4. The control gates of the third and fourth transfer transistors 124c and 124d receive signals from the voltage conversion circuit 123.

As illustrated in FIG. 5, a row decoder 13 has a NAND circuit 131, a NOT circuit 132, and a voltage conversion circuit 133 for each memory block MB.

Each NAND circuit 131 receives an address signal Address from the control signal generation unit 16 and outputs it to the NOT circuit 132. The NOT circuit 132 receives a signal from the NAND circuit 131 and outputs it to the voltage conversion circuit 133. The voltage conversion circuit 133 converts the voltage of the signal received from the NOT circuit 132, and then outputs the converted signal to a control gate of a first transfer transistor 134a described below.

As illustrated in FIG. 5, the row decoder 13 also has pair of first and second transfer transistors 134a and 134b for memory strings MS connected to the same source-side selection gate line SGS.

One end of the first transfer transistor 134a receives a signal $Sg_{SGS}$ from the control signal generation unit 16. The signal $Sg_{SGS}$ is a signal for driving a particular source-side selection gate line SGS. The other end of each first transfer transistor 134a is connected to a source-side selection gate line SGS. The control gate of each first transfer transistor 134a receives a signal from the voltage conversion circuit 133.

One end of each second transfer transistor 134b receives a signal $Sg_{SGSOFF}$ from the control signal generation unit 16. The signal $Sg_{SGSOFF}$ is a signal for disabling a source-side selection gate line SGS. The other end of each second transfer transistor 134b is connected to a source-side selection gate line SGS. The control gate of each second transfer transistor 134b receives a signal from the NAND circuit 131.

As illustrated in FIG. 5, the row decoder 13 also has third and fourth transfer transistors 134c and 134d for each memory block MB.

One ends of the third and fourth transfer transistors 134c and 134d receive signals $Sg_{WL1}$ and $Sg_{WL2}$, respectively, from the control signal generation unit 16. The signals $Sg_{WL1}$ and $Sg_{WL2}$ are signals for driving the word lines WL1 and WL2. The other ends of the third and fourth transfer transistors 134c and 134d are connected to the word lines WL1 and WL2. The control gates of the third and fourth transfer transistors 134c and 134d receive signals from the voltage conversion circuit 133.

Figure 6:
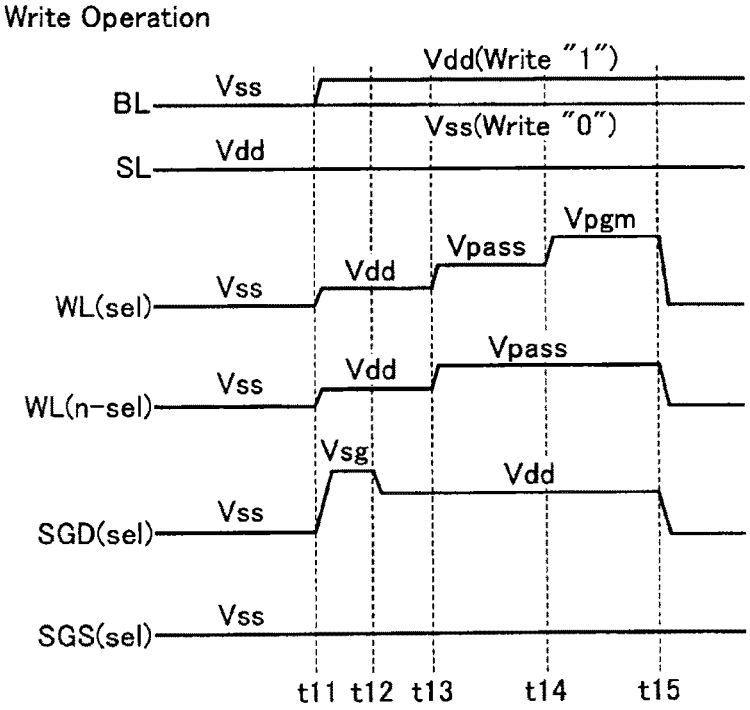
FIG. 6 is a timing chart illustrating a write operation of the non-volatile semiconductor storage device 100 according to the first embodiment.
Figure 7:
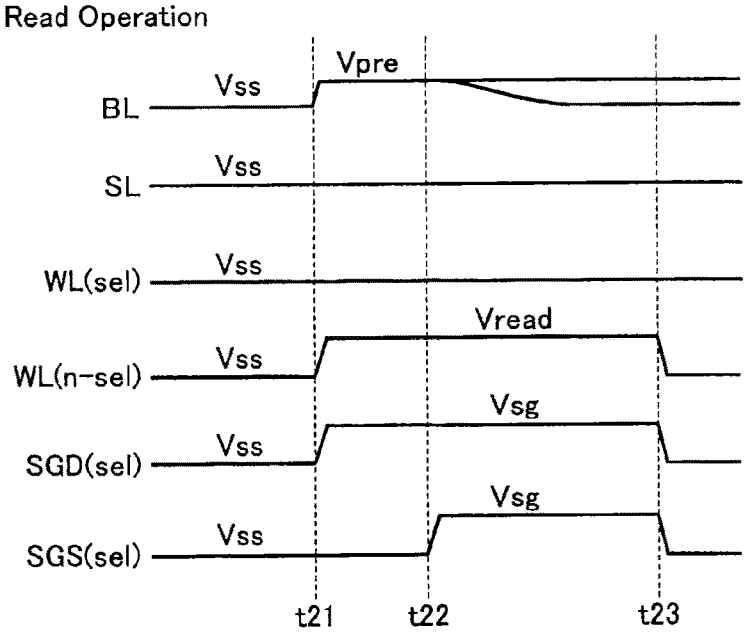
FIG. 7 is a timing chart illustrating a read operation of the non-volatile semiconductor storage device 100 according to the first embodiment.
Figure 8:
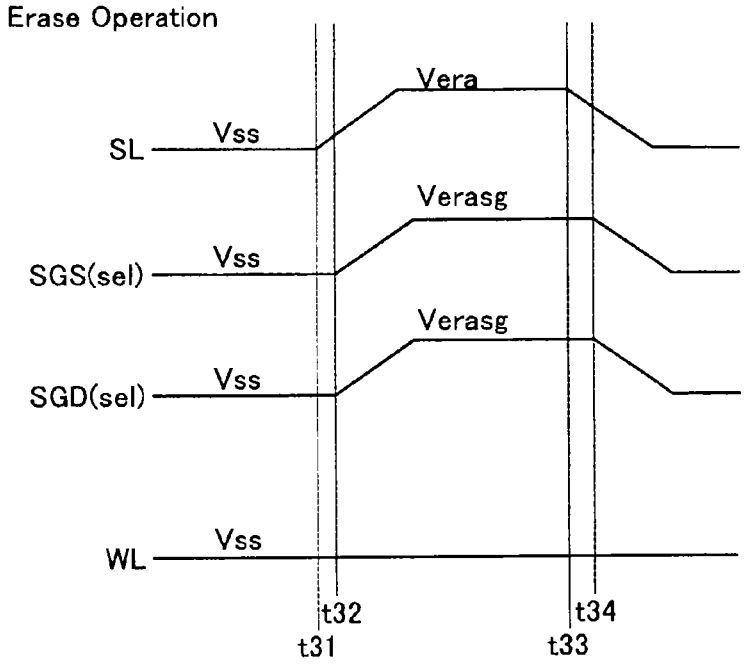
FIG. 8 is a timing chart illustrating an erase operation of the non-volatile semiconductor storage device 100 according to the first embodiment.

Operation of Non-Volatile Semiconductor Storage Device 100 in First Embodiment An operation of the non-volatile semiconductor storage device 100 of the first embodiment will now be described below. Referring first to FIGS. 6 to 8, write, read, and erase operations of the non-volatile semiconductor storage device 100 of the first embodiment will be described below. The operations illustrated in FIGS. 6 to 8 are performed by the control signal generation unit 16. FIG. 6 is a timing chart illustrating a write operation of the non-volatile semiconductor storage device 100 according to the first embodiment; FIG. 7 is a timing chart illustrating a read operation thereof; and FIG. 8 is a timing chart illustrating an erase operation thereof.

In this case, it is assumed that the write, read, and erase operations are performed on one particular memory block MB. The word lines WL1 to WL4 are denoted by "word lines WL". One of the word lines WL1 to WL4 that is selected for write, read, or erase operations is denoted by a "selected word line WL (sel)". On the other hand, one of the word lines WL1 to WL4 that is not selected for such operations is denoted by an "unselected word line WL (n-sel)". One of the drain-side selection gate lines SGD that is selected for write, read, or erase operations is denoted by a "selected drain-side selection gate line SGD (sel)". On the contrary, one of the drain-side selection gate lines SGD that is not selected for such operations is denoted by an "unselected drain-side selection gate line SGD (n-sel)". One of the source-side selection gate lines SGS that is selected for write, read, or erase operations is denoted by a "selected source-side selection gate line SGS (sel)". Meanwhile, one of the source-side selection gate lines SGS that is not selected for such operations is denoted by an "unselected source-side selection gate line SGS (n-sel)".

Furthermore, one of the memory blocks MB that is selected for write, read, or erase operations is denoted by a "selected memory block MB (sel)". On the other hand, one of the memory blocks MB that is not selected for such operations is denoted by an "unselected memory block MB (n-sel)". One of the memory strings MS that is selected for write, read, or erase operations is denoted by a "selected memory string MS (sel)". On the contrary, one of the memory strings MS that is not selected for such operations is denoted by an "unselected memory string MS (n-sel)". One of the drain-side selection transistors SDTr that is selected for write, read, or erase operations is denoted by a "selected drain-side selection transistor SDTr (sel)". Meanwhile, one of the drain-side selection transistors SDTr that is not selected for such operations is denoted by an "unselected drain-side selection transistor SDTr (n-sel)". One of the source-side selection transistors SSTr that is selected for write, read, or erase operations is denoted by a "selected source-side selection transistor SSTr (sel)". In contrast, one of the source-side selection transistors SSTr that is not selected for such operations is denoted by an "unselected source-side selection transistor SSTr (n-sel)".

In write operation, as illustrated in FIG. 6, the source line SL is initially set at a voltage Vdd, while the others set at a ground voltage Vss. Then, in writing "1" at time t11, the bit line BL is boosted to the voltage Vdd. Alternatively, in writing "0" at time t11, the bit line BL is maintained at the ground voltage Vss. In addition, at time t11, a selected word line WL (sel) and unselected word lines WL (n-sel) are boosted to the voltage Vdd. Furthermore, at time tll, a selected drain-side selection gate line SGD (sel) is boosted to a voltage Vsg. The voltage Vdd is, e.g., on the order of 3V to 4V. The voltage Vsg is, e.g., on the order of 4V. Note that unselected drain-side selection gate lines SGD (n-sel) and unselected source-side selection gate lines SGS (n-sel) are set at the ground voltage Vss. In addition, the word lines WL in unselected blocks MB (n-sel) are set in a floating state.

Subsequently, at time t12, the selected drain-side selection gate line SGD (sel) is dropped to the voltage Vdd. Then, at time t13, the selected word line WL (sel) and the unselected word lines WL (n-sel) are boosted to a voltage Vpass. Subsequently, at time t14, the selected word line WL (sel) is boosted to a voltage Vpgm. The voltage Vpass is, e.g., 10V. The voltage Vpgm is, e.g., 18V.

Then, at time t15, the selected word line WL (sel), the unselected word lines WL (n-sel), and the selected drain-side selection gate line SGD (sel) are dropped to the ground voltage Vss.

Through this operation, electric charges are accumulated in the control gate of the memory transistor MTr in a selected memory string MS (sel) that is connected to the selected word line WL (sel). As a result, data is written to the memory transistor MTr.

In read operation, as illustrated in FIG. 7, the bit line BL, the source line SL, the selected word line WL (sel), the unselected word lines (n-sel), the selected drain-side selection gate line SGD (sel), and the selected source-side selection gate line SGS (sel) are initially set at the ground voltage Vss. Note that the unselected drain-side selection gate lines SGD (n-sel) and the unselected source-side selection gate lines SGS (n-sel) are set at the ground voltage Vss. Each word line WL in an unselected memory block MB (n-sel) is set in a floating state.

Then, at time t21, the bit line BL is boosted to a voltage Vpre. The voltage Vpre is, e.g., on the order of 1V. In addition, at time t21, the unselected word lines WL (n-sel) are boosted to a voltage Vread. The voltage Vread is, e.g., on the order of 4V. In addition, at time t21, the selected drain-side selection gate line SGD (sel) is boosted to the voltage Vsg. Then, at time t22, the selected source-side selection gate line SGS (sel) is boosted to the voltage Vsg.

Subsequently, at time t23, the unselected word lines WL (n-sel), the selected drain-side selection gate line SGD (sel), and the selected source-side selection gate line SGS (sel) are dropped to the ground voltage Vss.

Through this operation, such current is detected that flows from the bit line BL through the selected memory string MS (sel) into the source line SL (from one end to the other of the memory string MS). Then, data is read through the comparison of the magnitude (large or small) of the detected current.

In erase operation, as illustrated in FIG. 8, the source line SL, the word line WL, the selected drain-side selection gate line SGD (sel), and the selected source-side selection gate line SGS (sel) are initially set at the ground voltage Vss. Note that the bit line BL is set in a floating state. In addition, the unselected drain-side selection gate lines SGD (n-sel) and the unselected source-side selection gate lines SGS (n-sel) are set in a floating state. Furthermore, each word line WL in the unselected block MB (n-sel) is set in a floating state.

Then, at time t31, the source line SL is boosted to a voltage Vera. Subsequently, at time t32, the selected drain-side selection gate line SGD (sel) and the selected source-side selection gate line SGS (sel) are boosted to a voltage Verasg. The voltage Vera is on the order of 20V. The voltage Verasg is on the order of 15V.

Then, at time t33, the source line SL is dropped to the ground voltage Vss. Subsequently, at time t34, the selected drain-side selection gate line SGD (sel) and the selected source-side selection gate line SGS (sel) are dropped to the ground voltage Vss.

Through this operation, GIDL (Gate Induced Drain Leak) current is produced near the gates of the source-side selection transistors SSTr, and the generated holes flow into the memory columnar semiconductor layers 35. As a result, the potential of the source line SL is transferred to the memory columnar semiconductor layers 35. On the other hand, electrons flow toward the semiconductor substrate Ba. Consequently, due to the potential difference between the memory columnar semiconductor layer 35 and the first to fourth word-line conductive layers 32a to 32d (e.g., set at 0V), the electrons are extracted from the electric charge storage layer 34b included in the memory transistors MTr1 to MTr4. That is, the erase operation is performed.

Figure 9:
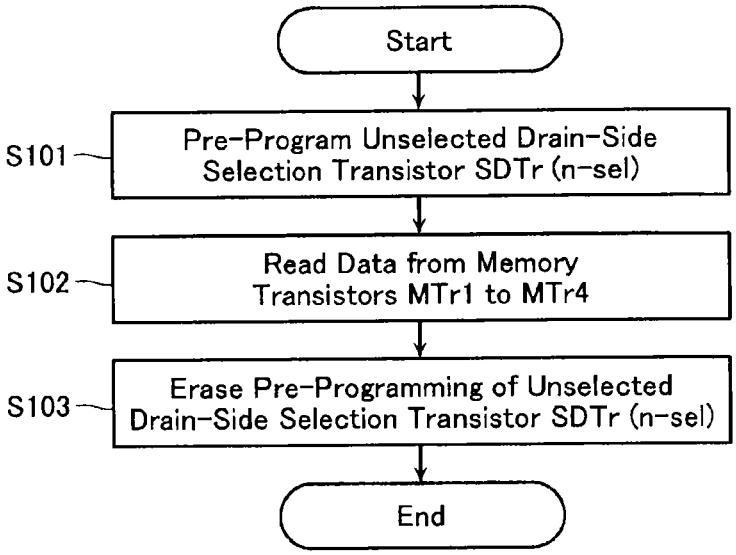
FIG. 9 is a flowchart illustrating an operation to be performed before and after the read operation in the non-volatile semiconductor storage device 100 according to the first embodiment.

Referring now to FIG. 9, an operation to be performed before and after the above-mentioned read operation will be described below. The operation illustrated in FIG. 9 is performed by the control signal generation unit 16. FIG. 9 is a flowchart illustrating an operation to be performed before and after the read operation of the non-volatile semiconductor storage device 100 of the first embodiment.

As illustrated in FIG. 9, pre-programming (pre-writing) is first performed on the unselected drain-side selection transistor SDTr (n-sel) that is connected to an unselected memory string MS (n-sel) (step S101). The pre-programming is performed by accumulating electric charges in an electric charge storage layer 46b of the drain-side selection transistor layer 40. This pre-programming increases the threshold voltage of the drain-side selection transistor SDTr.

Then, data is read from the memory transistors MTr1 to MTr4 in the selected memory string MS (sel) (step S102).

Subsequently, the pre-programming of the unselected drain-side selection transistor SDTr (n-sel) connected to the unselected memory string MS (n-sel) is erased (step S103). The pre-programming erase is performed by discharging electric charges from the electric charge storage layer 46b of the drain-side selection transistor layer 40. This pre-programming erase decreases the threshold voltage of the drain-side selection transistor SDTr.

Figure 10:
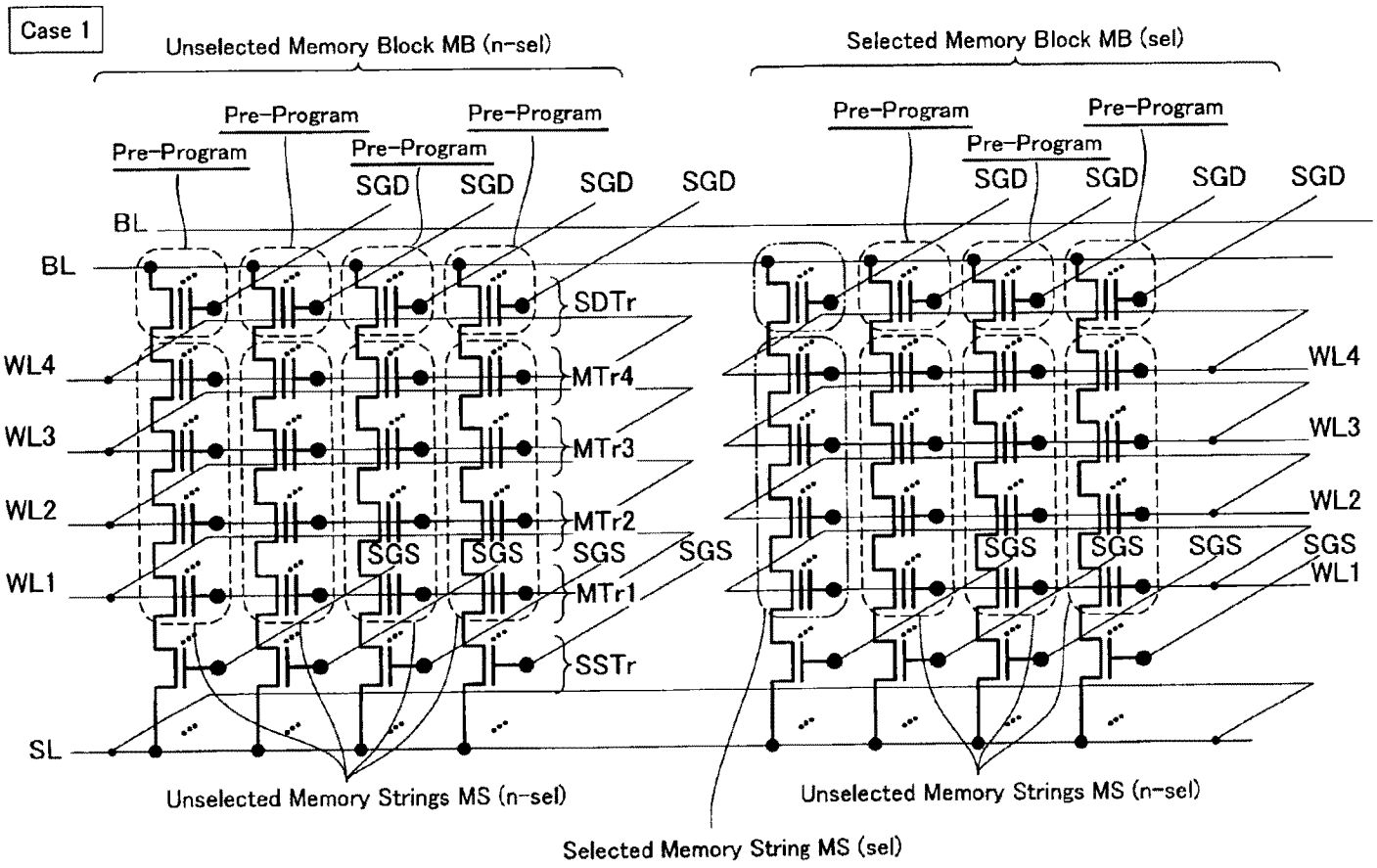
FIG. 10 illustrates "Case 1" of the pre-programming at step S101.

The above-mentioned pre-programming at step S101 is performed on unselected drain-side selection transistors SDTr (n-sel) that are connected to unselected memory strings MS (n-sel) in an unselected memory block MB (n-sel), as illustrated in "Case 1" of FIG. 10. The pre-programming is also performed on unselected drain-side selection transistors SDTr (n-sel) that are connected to unselected memory strings MS (n-sel) in a selected memory block MB (sel).

Figure 11:
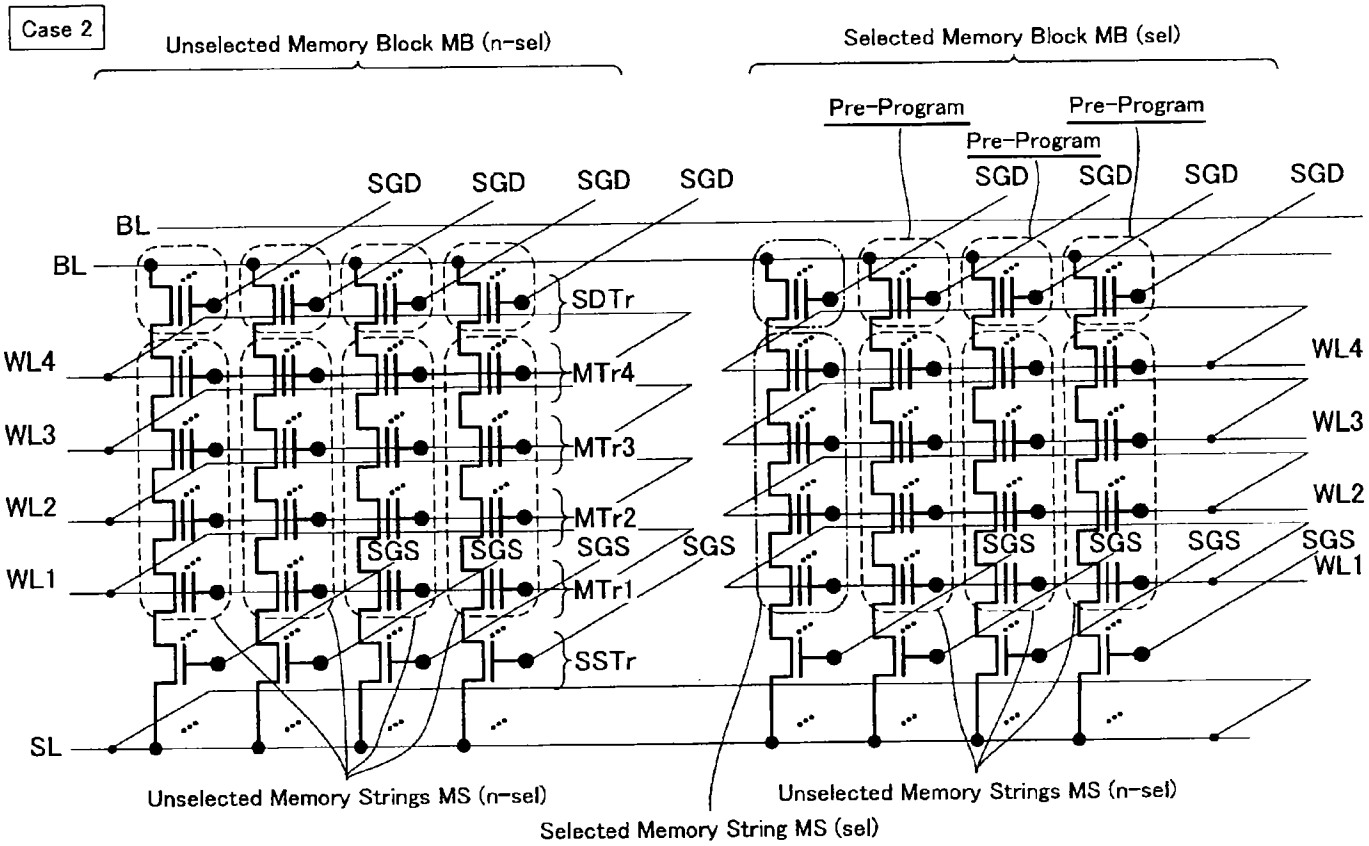
FIG. 11 illustrates "Case 2" of the pre-programming at step S101.

Alternatively, as illustrated in "Case 2" of FIG. 11, the above-mentioned pre-programming at step S101 is only performed on unselected drain-side selection transistors SDTr (n-sel) that are connected to unselected memory strings MS (n-sel) in a selected memory block MB (sel).

Figure 12:
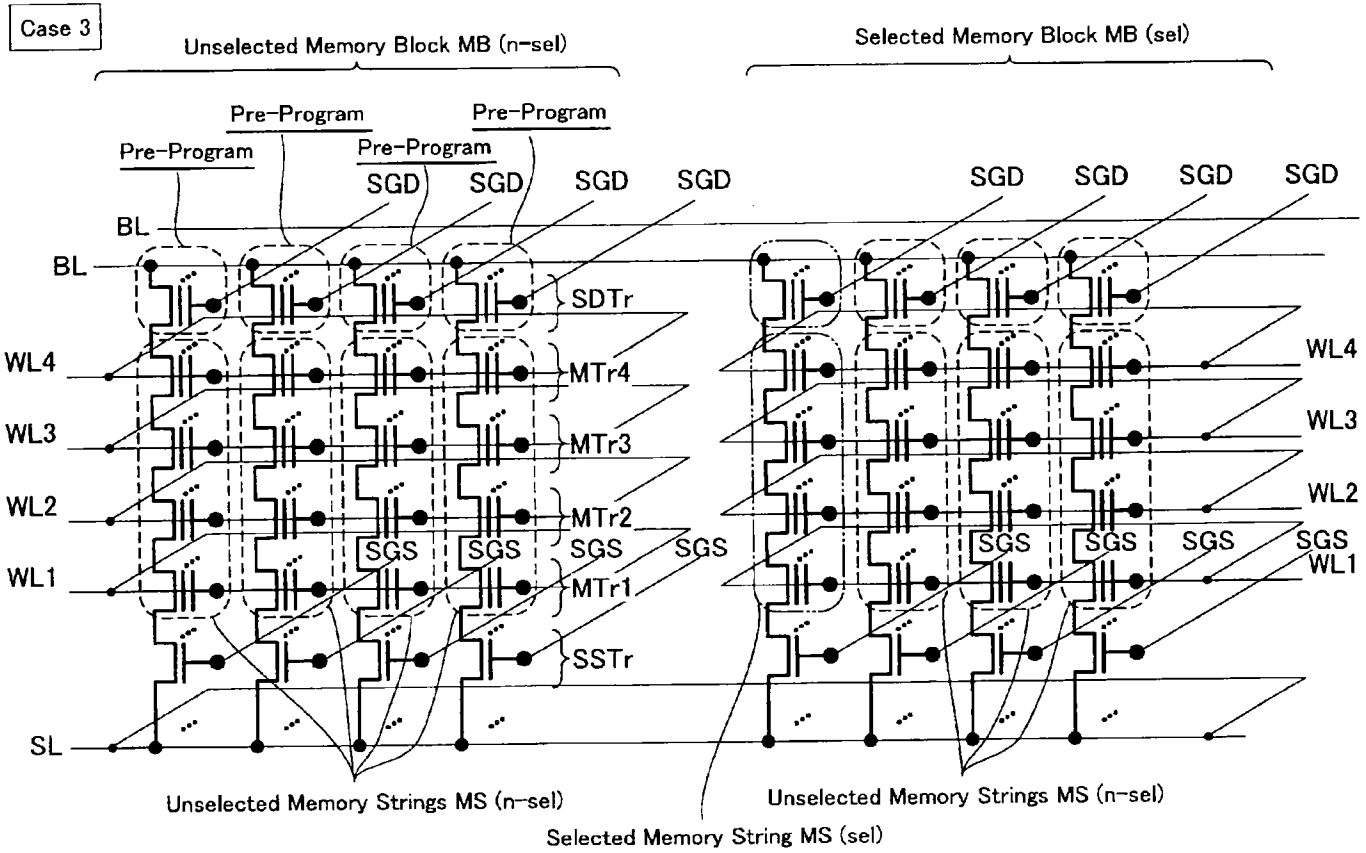
FIG. 12 illustrates "Case 3" of the pre-programming at step S101.

In addition, as illustrated in "Case 3" of FIG. 12, the above-mentioned pre-programming at step S101 is only performed on unselected drain-side selection transistors SDTr (n-sel) in an unselected memory block MB (n-sel).

Figure 13:
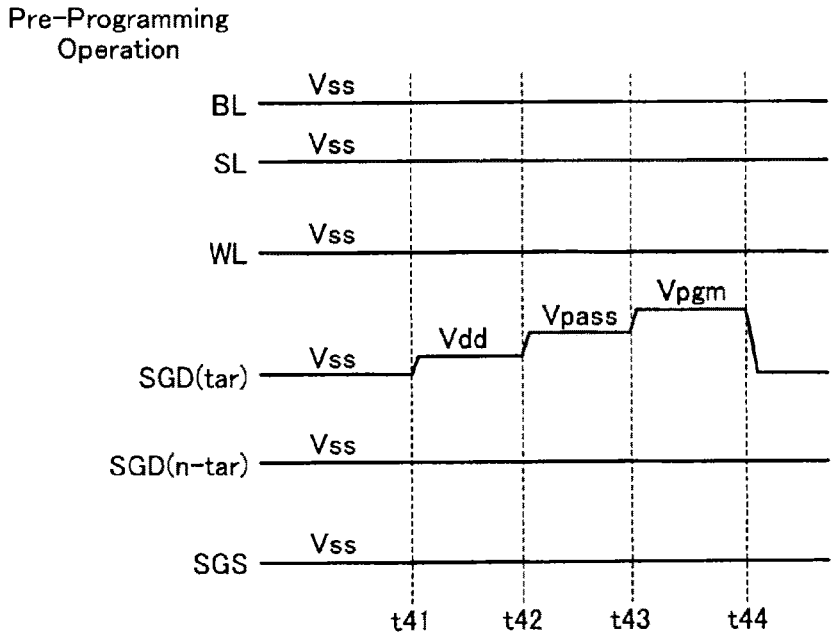
FIG. 13 is a timing chart illustrating the pre-programming operation (step S101)

Referring now to FIG. 13, the pre-programming operation (step S101) will be described below. The operation illustrated in FIG. 13 is performed by the control signal generation unit 16. FIG. 13 is a timing chart illustrating the pre-programming operation.

In this case, one of the drain-side selection gate lines SGD that is subject to the pre-programming operation is hereinafter denoted by a "target drain-side selection gate line SGD (tar)". One of the drain-side selection gate lines SGD that is not subject to the pre-programming operation is denoted by a "non-target drain-side selection gate line SGD (n-tar)". In addition, one of the source-side selection gate lines SGS that is subject to the pre-programming operation is denoted by a "target source-side selection gate line SGS (tar)". One of the source-side selection gate lines SGS that is not subject to the pre-programming operation is denoted by a "non-target source-side selection gate line SGS (n-tar)".

In writing data to drain-side selection transistors SDTr, unlike the word lines WL1 to WL4, data cannot be selectively written to a plurality of drain-side selection transistors SDTr that are connected to a selected drain-side selection gate line SGD (sel). Thus, "0" data is collectively written to all of the drain-side selection transistors SDTr. As such, all of the bit lines BL are set at the ground voltage Vss.

As illustrated in FIG. 13, a bit line BL, a source line SL, a word line WL, a target drain-side selection gate line SGD (tar), a non-target drain-side selection gate line SGD (n-tar), and a source-side selection gate line SGS are initially set at the ground voltage Vss. Then, at time t41, the target drain-side selection gate line SGD (tar) is boosted to the voltage Vdd. Then, at time t42, the target drain-side selection gate line SGD (tar) is boosted to the voltage Vpass. Subsequently, at time t43, the target drain-side selection gate line SGD (tar) is boosted to the voltage Vpgm. Thereafter, at time t44, the target drain-side selection gate line SGD (tar) is dropped to the ground voltage Vss. Meanwhile, the above-mentioned operation is restated as follows: the target drain-side selection gate line SGD (tar) is boosted in a step-like manner.

Through this operation, due to the potential difference between the drain-side columnar semiconductor layer 47 and the drain-side conductive layer 42, electric charges are accumulated in the electric charge storage layer 46b. That is, the pre-programming is performed.

Figure 14:
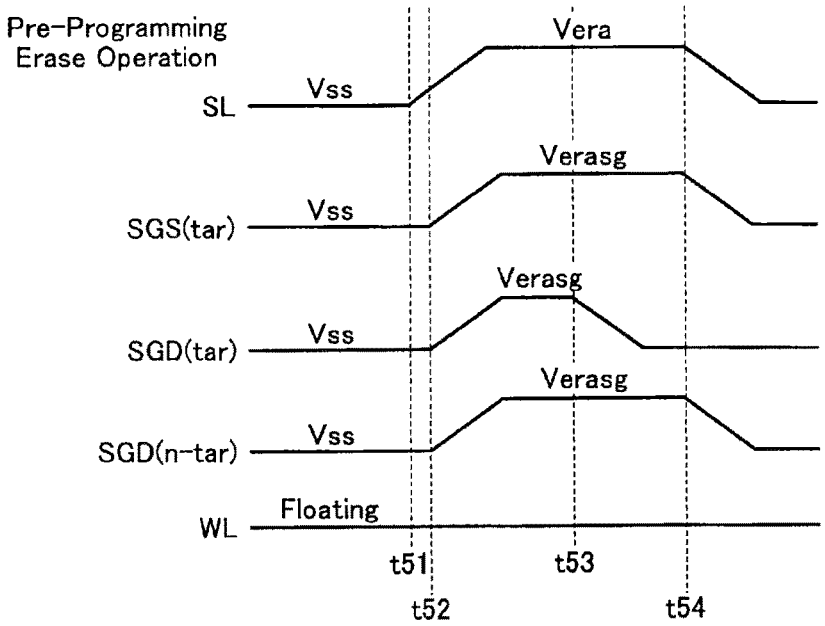
FIG. 14 is a timing chart illustrating the pre-programming erase operation (step S103)

Referring now to FIG. 14, the pre-programming erase operation (step S103) will be described below. The operation illustrated in FIG. 14 is performed by the control signal generation unit 16. FIG. 14 is a timing chart illustrating the pre-programming erase operation.

As illustrated in FIG. 14, the source line SL, the target source-side selection gate line SGS (tar), the target drain-side selection gate line SGD (tar), and the non-target drain-side selection gate line SGD (n-tar) are initially set at the ground voltage Vss. The word lines WL are set in a floating state. Each word line WL and non-target source-side selection gate line SGS (n-tar) in an unselected block MB (n-sel) are set in a floating state.

Firstly, at time t51, the source line SL is boosted to the voltage Vera. Then, at time t52, the target source-side selection gate line SGS (tar), the target drain-side selection gate line SGD (tar), and the non-target drain-side selection gate line SGD (n-tar) are boosted to the voltage Verasg.

Subsequently, at time t53, the target drain-side selection gate line SGD (tar) is dropped to the ground voltage Vss. Then, at time t54, the source line SL, the target source-side selection gate line SGS (tar), and the non-target drain-side selection gate line SGD (n-tar) are dropped to the ground voltage Vss.

Through this operation, GIDL (Gate Induced Drain Leak) current is produced near the gates of the source-side selection transistors SSTr, and the generated holes flow through the memory columnar semiconductor layers 35 into the drain-side columnar semiconductor layers 47. As a result, the potential of the source line SL is transferred to the drain-side columnar semiconductor layers 47. On the other hand, electrons flow toward the semiconductor substrate Ba. Consequently, the drain-side columnar semiconductor layers 47 is boosted by the GIDL current. Then, due to the potential difference between the drain-side columnar semiconductor layers 47 and the drain-side selection gate lines SGD (e.g., set at 0V), the electrons are deleted in the electric charge storage layers 46b included in the drain-side selection transistors SDTr. That is, the pre-programming erase operation is performed.

Advantages of Non-Volatile Semiconductor Storage Device 100 in First Embodiment Advantages of the non-volatile semiconductor storage device 100 of the first embodiment will now be described below. As can be seen from the above lamination structure, the non-volatile semiconductor storage device 100 according to the first embodiment may achieve high integration.

In addition, as described in the above manufacturing process of the non-volatile semiconductor storage device 100, each layer corresponding to respective memory transistors MTr, source-side selection transistors SSTr, and drain-side selection transistors SDTr may be manufactured in a certain number of lithography steps, irrespective of the number of laminated layers. That is, the non-volatile semiconductor storage device 100 may be manufactured at a lower cost.

In addition, the non-volatile semiconductor storage device 100 is configured to be able to control the threshold voltages of the drain-side selection transistors SDTr. Accordingly, prior to reading data, the non-volatile semiconductor storage device 100 may control the threshold voltage to be a high value for an unselected drain-side selection transistor SDTr (n-sel) connected to an unselected memory string MS (n-sel). Therefore, when reading data, the non-volatile semiconductor storage device 100 may suppress the leakage current that would flow from a bit line BL to a source line SL through an unselected memory string MS (n-sel). That is, the non-volatile semiconductor storage device 100 allows for more accurate read operation.

Second Embodiment

Configuration of Non-Volatile Semiconductor Storage Device in Second Embodiment

Figure 15:
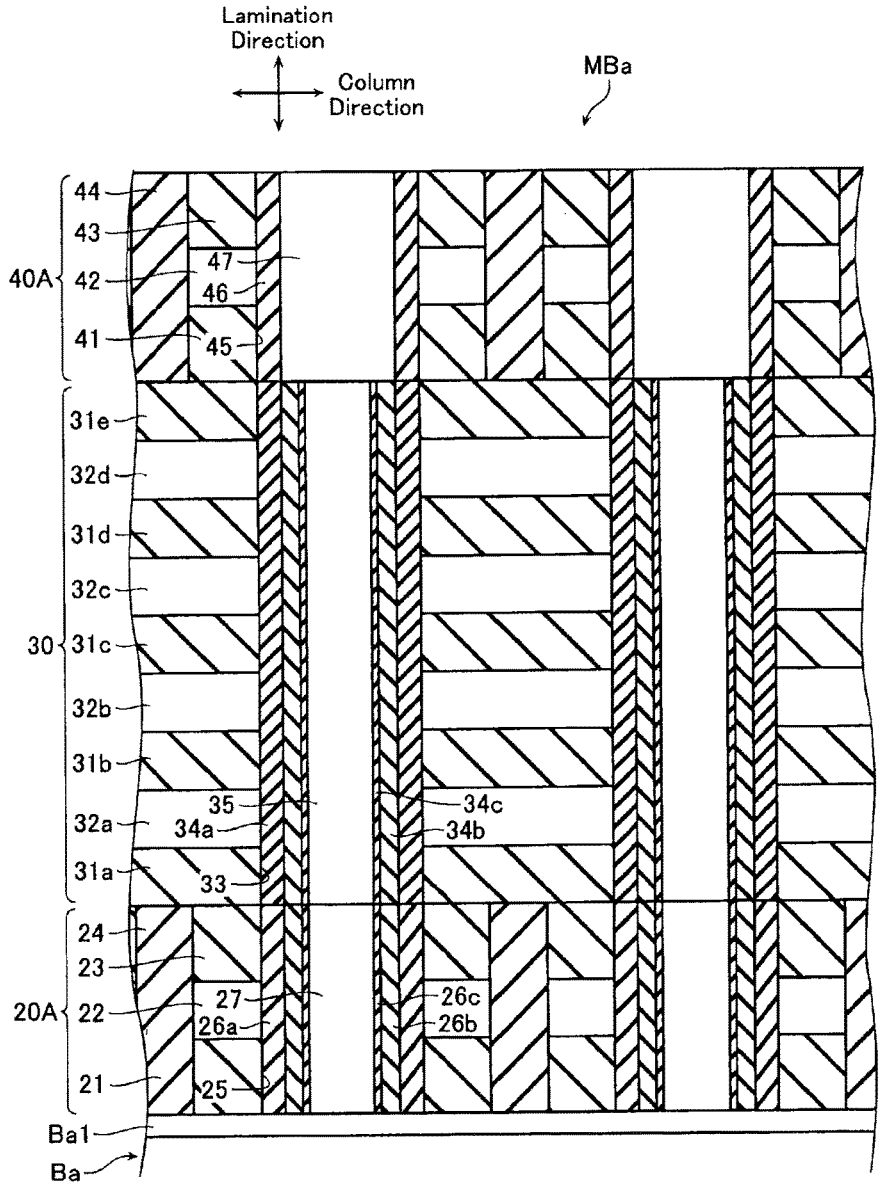
FIG. 15 is a cross-sectional view of one memory block MBa according to a second embodiment.

Referring now to FIG. 15, a configuration of a non-volatile semiconductor storage device according to a second embodiment will be described below. FIG. 15 is a cross-sectional view of one memory block MBa according to the second embodiment. Note that the same reference numerals represent the same components as the first embodiment, and description thereof will be omitted in the second embodiment.

The non-volatile semiconductor storage device according to the second embodiment has memory blocks MBa different from the first embodiment.

Each memory block MBa has a source-side selection transistor layer 20A and a drain-side selection transistor layer 40A that are different from the first embodiment.

The source-side selection transistor layer 20A has block insulation layers 26a, electric charge storage layers 26b, and tunnel insulation layers 26c, instead of the source-side gate insulation layers 26. The block insulation layers 26a are formed with a certain thickness on the sidewalls of the source-side holes 25. The electric charge storage layers 26b are formed with a certain thickness on the sidewalls of the block insulation layers 26a. The tunnel insulation layers 26c are formed with a certain thickness on the sidewalls of the electric charge storage layers 26b. The block insulation layers 26a and the tunnel insulation layers 26c are composed of, e.g., silicon oxide ($SiO_2$). The electric charge storage layers 26b are composed of, e.g., silicon nitride (SiN).

The drain-side selection transistor layer 40A has drain-side gate insulation layers 46, instead of the block insulation layers 46a, the electric charge storage layers 46b, and the tunnel insulation layers 46c. The drain-side gate insulation layers 46 are formed with a certain thickness on the sidewalls of the drain-side holes 45. The drain-side gate insulation layers 46 are composed of, e.g., silicon oxide ($SiO_2$).

Operation of Non-Volatile Semiconductor Storage Device in Second Embodiment

Figure 16:
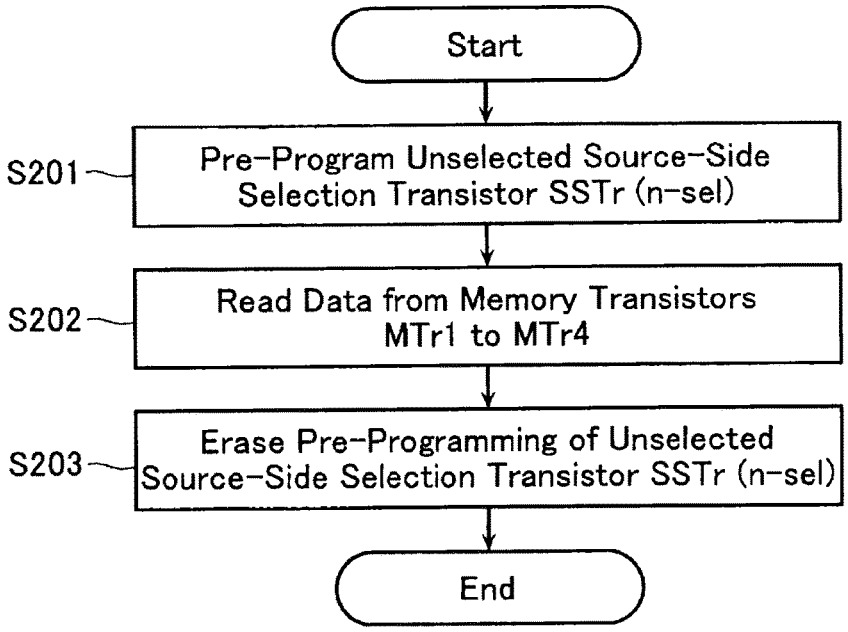
FIG. 16 is a flowchart illustrating an operation to be performed before and after the read operation in the non-volatile semiconductor storage device according to the second embodiment.

Referring now to FIG. 16, an operation to be performed before and after the read operation according to the second embodiment will be described below. The operation illustrated in FIG. 16 is performed by the control signal generation unit 16. FIG. 16 is a flowchart illustrating an operation to be performed before and after the read operation of the non-volatile semiconductor storage device according to the second embodiment.

As illustrated in FIG. 16, pre-programming (pre-writing) is first performed on an unselected source-side selection transistor SSTr (n-sel) that is connected to an unselected memory string MS (n-sel) (step S201). The pre-programming is performed by accumulating electric charges in an electric charge storage layer 26b of the source-side selection transistor layer 20A. The pre-programming increases the threshold voltage of the unselected source-side selection transistor SSTr (n-sel).

Then, data is read from the memory transistors MTr1 to MTr4 in the selected memory string (sel) (step S202).

Subsequently, the pre-programming of the unselected source-side selection transistor SSTr (n-sel) connected to the unselected memory string (n-sel) is erased (step S203). The pre-programming erase is performed by discharging electric charges from the electric charge storage layer 26b of the source-side selection transistor layer 20. This pre-programming erase decreases the threshold voltage of the unselected source-side selection transistor SSTr (n-sel).

Figure 17:
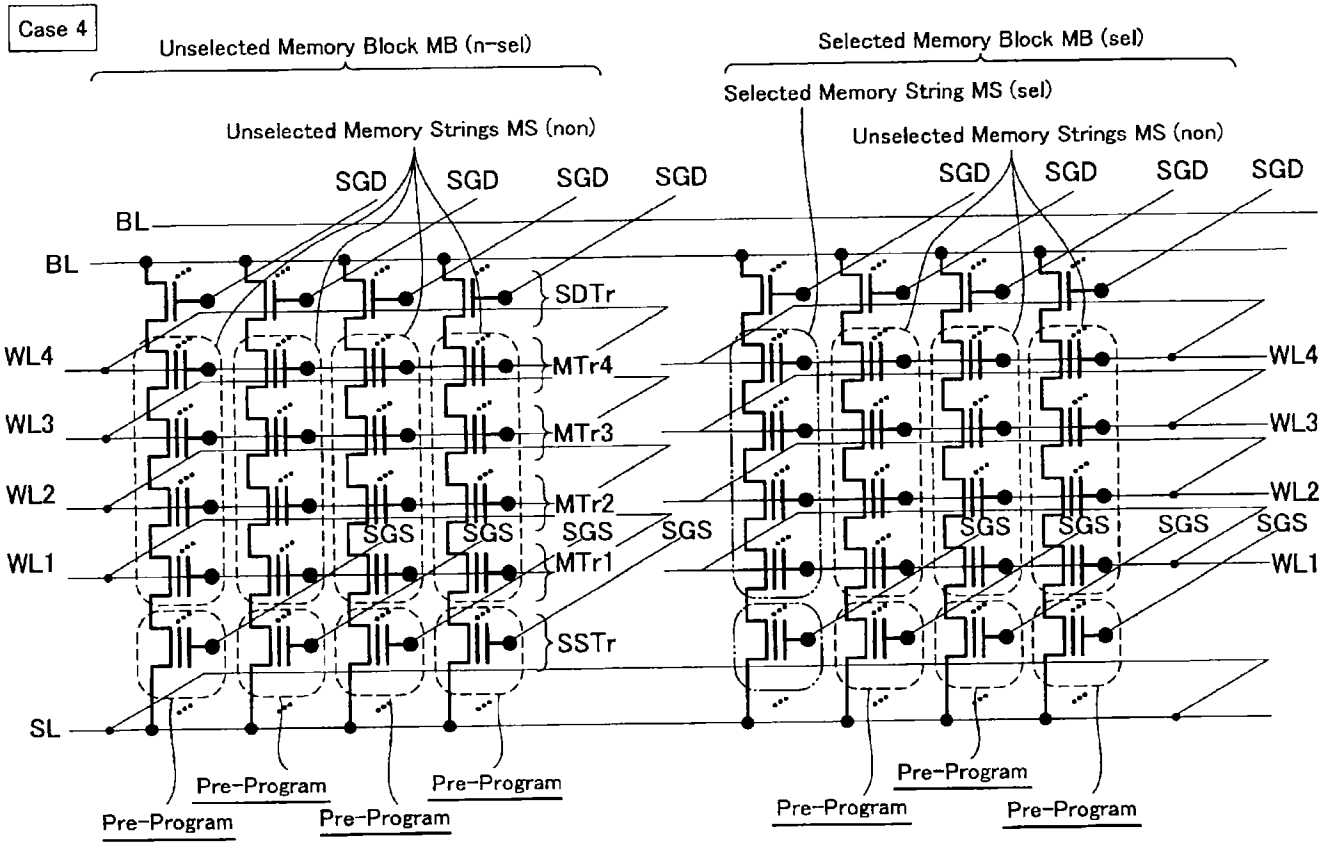
FIG. 17 illustrates "Case 4" of the pre-programming at step S201.

The above-mentioned pre-programming at step S201 is performed on unselected drain-side selection transistors SDTr (n-sel) that are connected to unselected memory strings MS (n-sel) in an unselected memory block MB (n-sel), as illustrated in "Case 4" of FIG. 17. The pre-programming is also performed on unselected drain-side selection transistors SDTr (n-sel) that are connected to unselected memory strings MS (n-sel) in a selected memory block MB (sel).

Figure 18:
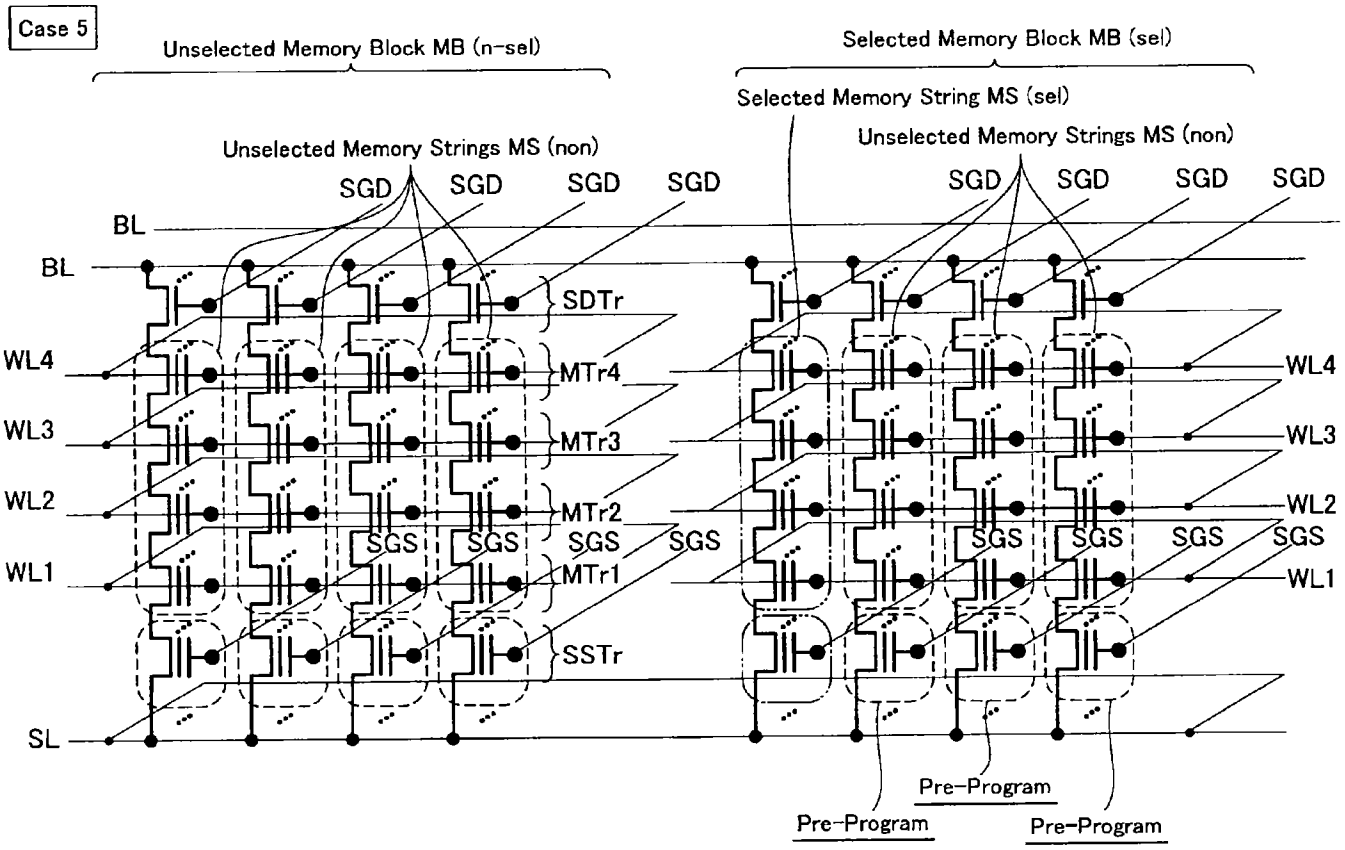
FIG. 18 illustrates "Case 5" of the pre-programming at step S201.

Alternatively, as illustrated in "Case 5" of FIG. 18, the above-mentioned pre-programming at step S201 is only performed on unselected drain-side selection transistors SDTr (n-sel) that are connected to unselected memory strings MS (n-sel) in a selected memory block MB (sel).

Figure 19:
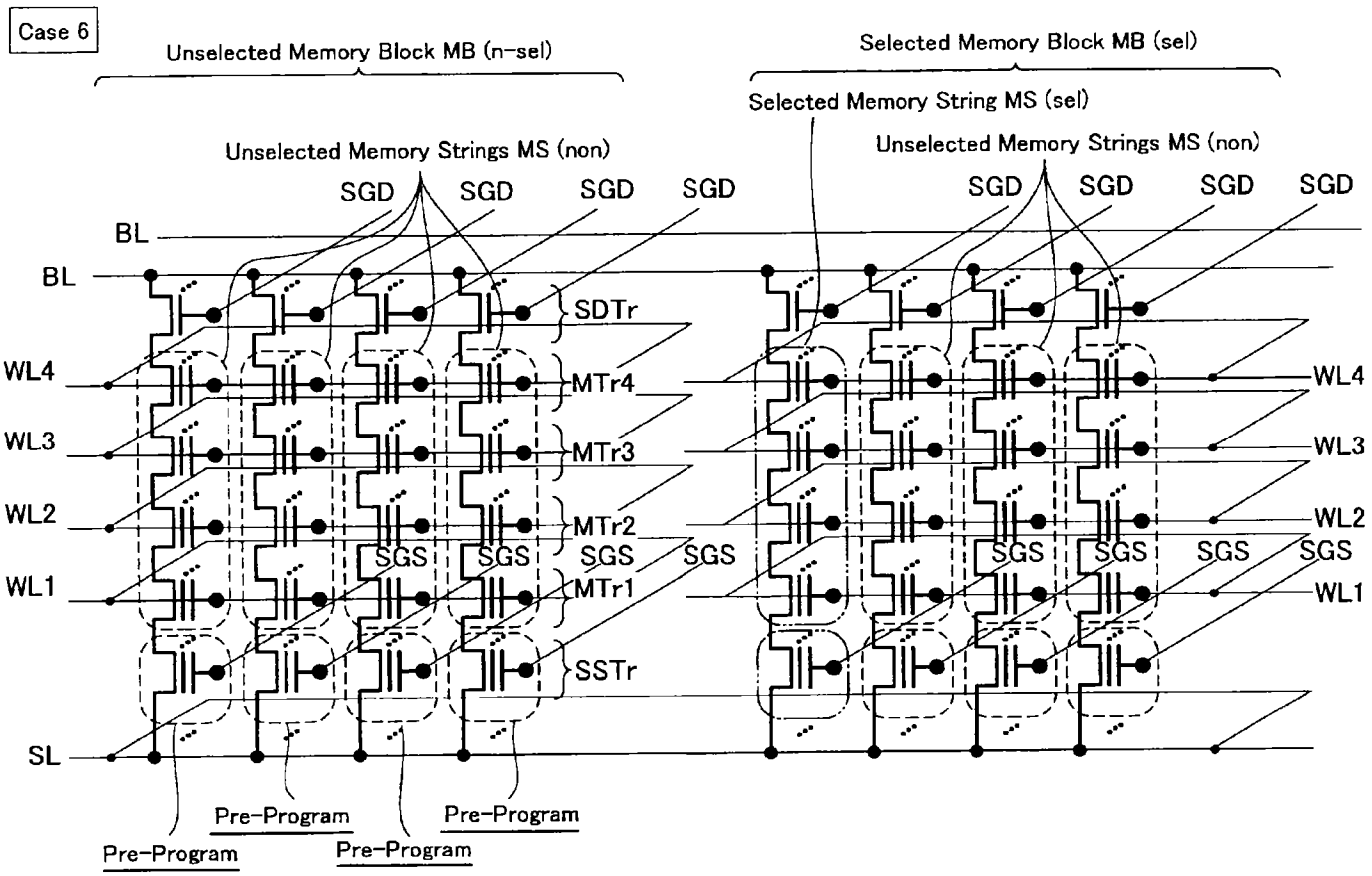
FIG. 19 illustrates "Case 6" of the pre-programming at step S201.

In addition, as illustrated in "Case 6" of FIG. 19, the above-mentioned pre-programming at step S201 is only performed on unselected drain-side selection transistors SDTr (n-sel) in an unselected memory block MB (n-sel).

Figure 20:
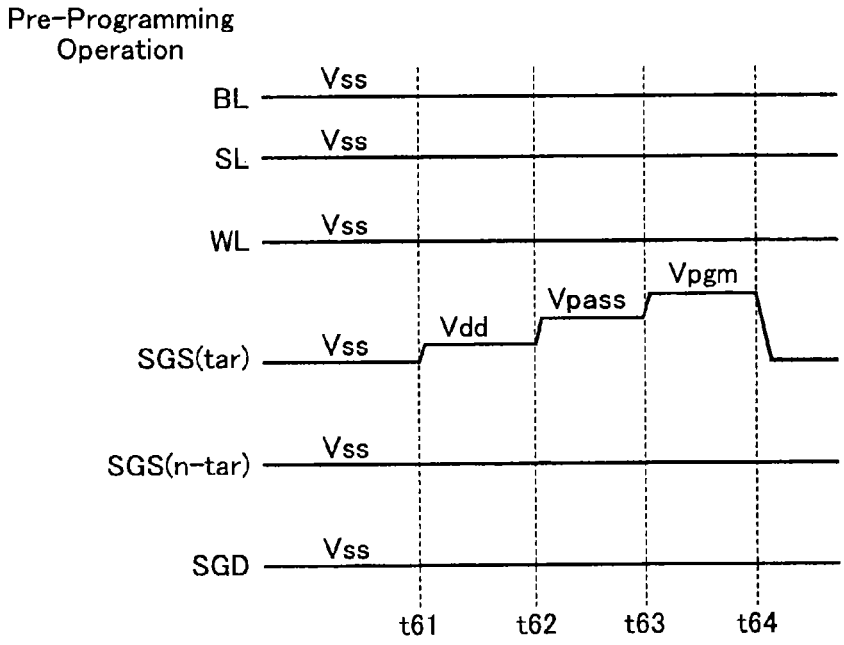
FIG. 20 is a timing chart illustrating the pre-programming operation (step S201)

Referring now to FIG. 20, the pre-programming operation (step S201) will be described below. The operation illustrated in FIG. 20 is performed by the control signal generation unit 16. FIG. 20 is a timing chart illustrating the pre-programming operation.

As illustrated in FIG. 20, all lines are initially set at the ground voltage Vss. Firstly, at time t61, the target source-side selection gate line SGS (tar) is boosted to the voltage Vdd. Then, at time t62, the target source-side selection gate line SGS (tar) is boosted to the voltage Vpass. Subsequently, at time t63, the target source-side selection gate line SGS (tar) is boosted to the voltage Vpgm. Thereafter, at time t64, the target source-side selection gate line SGS (tar) is dropped to the ground voltage Vss. Note that the above-mentioned operation is restated as follows: the target source-side selection gate line SGS (tar) is boosted in a step-like manner.

Through this operation, due to the potential difference between the source-side columnar semiconductor layers 27 and the source-side conductive layers 22, electric charges are accumulated in the electric charge storage layers 26b. That is, the pre-programming is performed.

Figure 21:
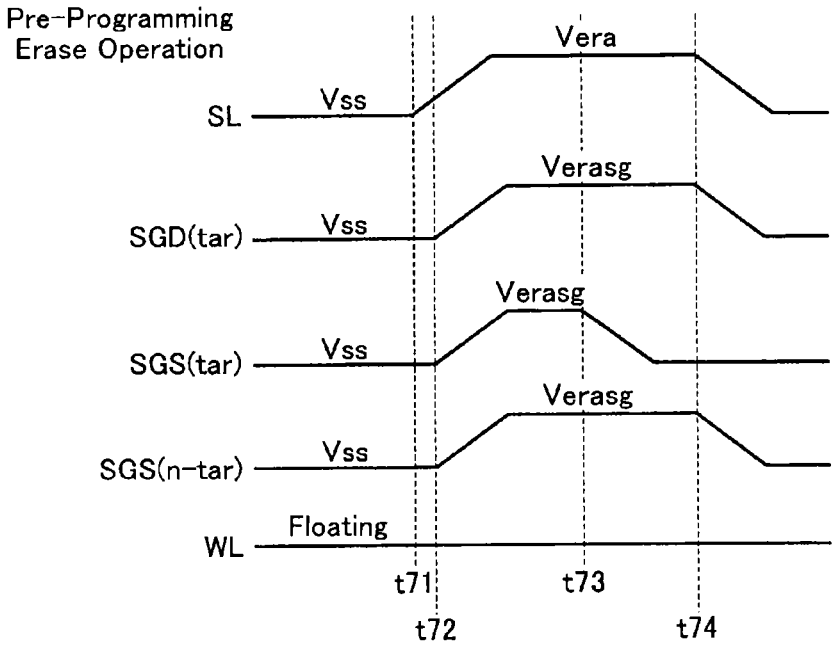
FIG. 21 is a timing chart illustrating the pre-programming erase operation (step S203)

Referring now to FIG. 21, the pre-programming erase operation (step S203) will be described below. The operation illustrated in FIG. 21 is performed by the control signal generation unit 16. FIG. 21 is a timing chart illustrating the pre-programming erase operation.

As illustrated in FIG. 21, the source line SL, the target source-side selection gate line SGS (tar), the non-target source-side selection gate line SGS (n-tar), and the target drain-side selection gate line SGD (tar) are initially set at the ground voltage Vss. The word line WL is set in a floating state. The non-target drain-side selection gate line SGD (n-tar) is set in a floating state.

Then, at time t71, the source line SL is boosted to the voltage Vera. Subsequently, at time t72, the target drain-side selection gate line SGD (tar), the non-target source-side selection gate line SGS (n-tar), and the target source-side selection gate line SGS (tar) are boosted to the voltage Verasg.

Then, at time t73, the target source-side selection gate line SGS (tar) is dropped to the ground voltage Vss. Subsequently, at time t74, the source line SL, the non-target source-side selection gate line SGS (n-tar), and the target drain-side selection gate line SGD (tar) are dropped to the ground voltage Vss.

Through this operation, GIDL (Gate Induced Drain Leak) current is produced near the gates of the source-side selection transistors SSTr, and the generated holes flow into the source-side columnar semiconductor layers 27. As a result, the potential of the source line SL is transferred to the source-side columnar semiconductor layers 27. On the other hand, electrons flow toward the semiconductor substrate Ba. Consequently, the source-side columnar semiconductor layers 27 is boosted by the GIDL current. Then, due to the potential difference between the source-side columnar semiconductor layers 27 and the source-side selection gate lines SGS (e.g., set at 0V), the electrons are deleted in the electric charge storage layers 26b included in the source-side selection transistors SSTr. That is, the pre-programming erase operation is performed.

Advantages of Non-Volatile Semiconductor Storage Device in Second Embodiment

Advantages of the non-volatile semiconductor storage device according to the second embodiment will now be described below. As can be seen from the above, the non-volatile semiconductor storage device according to the second embodiment is configured to be able to control the threshold voltages of the source-side selection transistors SSTr. Accordingly, prior to reading data, the non-volatile semiconductor storage device may control the threshold voltage to be a high value for an unselected source-side selection transistor SSTr (n-sel) connected to an unselected memory string MS (n-sel). Therefore, the non-volatile semiconductor storage device may suppress the leakage current that would flow from a bit line BL to a source line SL through an unselected memory string MS (n-sel). That is, as in the first embodiment, the non-volatile semiconductor storage device according to the second embodiment allows for more accurate read operation.

Third Embodiment

Configuration of Non-Volatile Semiconductor Storage Device in Third Embodiment

Figure 22:
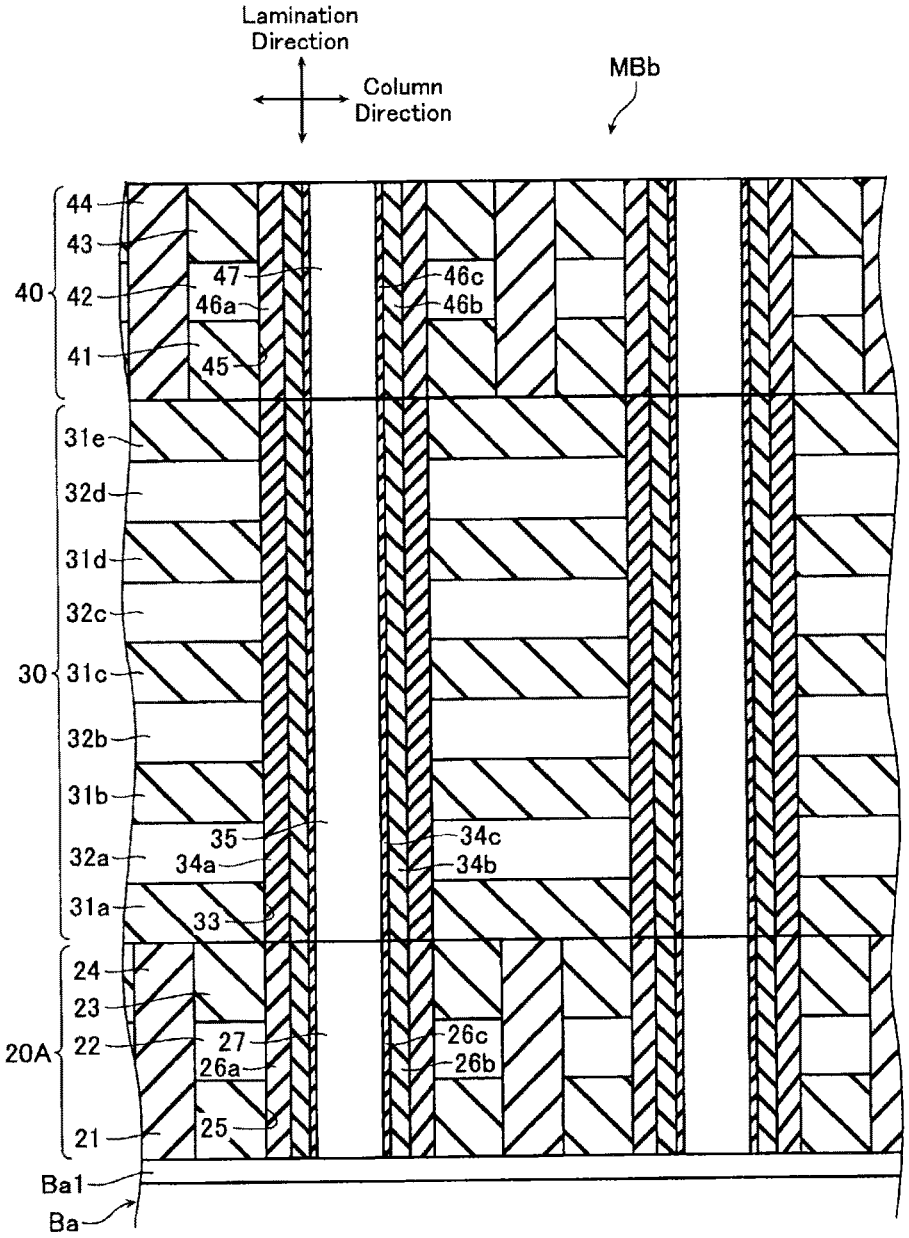
FIG. 22 is a cross-sectional view of one memory block MBb according to the third embodiment.

Referring now to FIG. 22, a configuration of a non-volatile semiconductor storage device according to a third embodiment will be described below. FIG. 22 is a cross-sectional view of one memory block MBb according to the third embodiment. Note that the same reference numerals represent the same components as the first and second embodiments, and description thereof will be omitted in the third embodiment.

As illustrated in FIG. 22, the non-volatile semiconductor storage device of the third embodiment has memory blocks MBb different from the first embodiment.

Each memory block MBb has the source-side selection transistor layer 20A, the memory transistor layer 30, and the drain-side selection transistor layer 40 as described in the first and second embodiments.

Operation of Non-Volatile Semiconductor Storage Device in Third Embodiment

An operation of the non-volatile semiconductor storage device of the third embodiment will now be described below. The control signal generation unit 16 according to the third embodiment performs operations as illustrated in FIG. 9 according to the first embodiment (step S101 to 5103) and in FIG. 16 according to the second embodiment (step S201 to S203).

Advantages of Non-Volatile Semiconductor Storage Device in Third Embodiment

Advantages of the non-volatile semiconductor storage device according to the third embodiment will be described below. The non-volatile semiconductor storage device of the third embodiment has the characteristics according to the first and second embodiments. Accordingly, the non-volatile semiconductor storage device of the third embodiment has the same advantages as the first and second embodiments.

Fourth Embodiment

Configuration of Non-Volatile Semiconductor Storage Device in Fourth Embodiment

Figure 23:
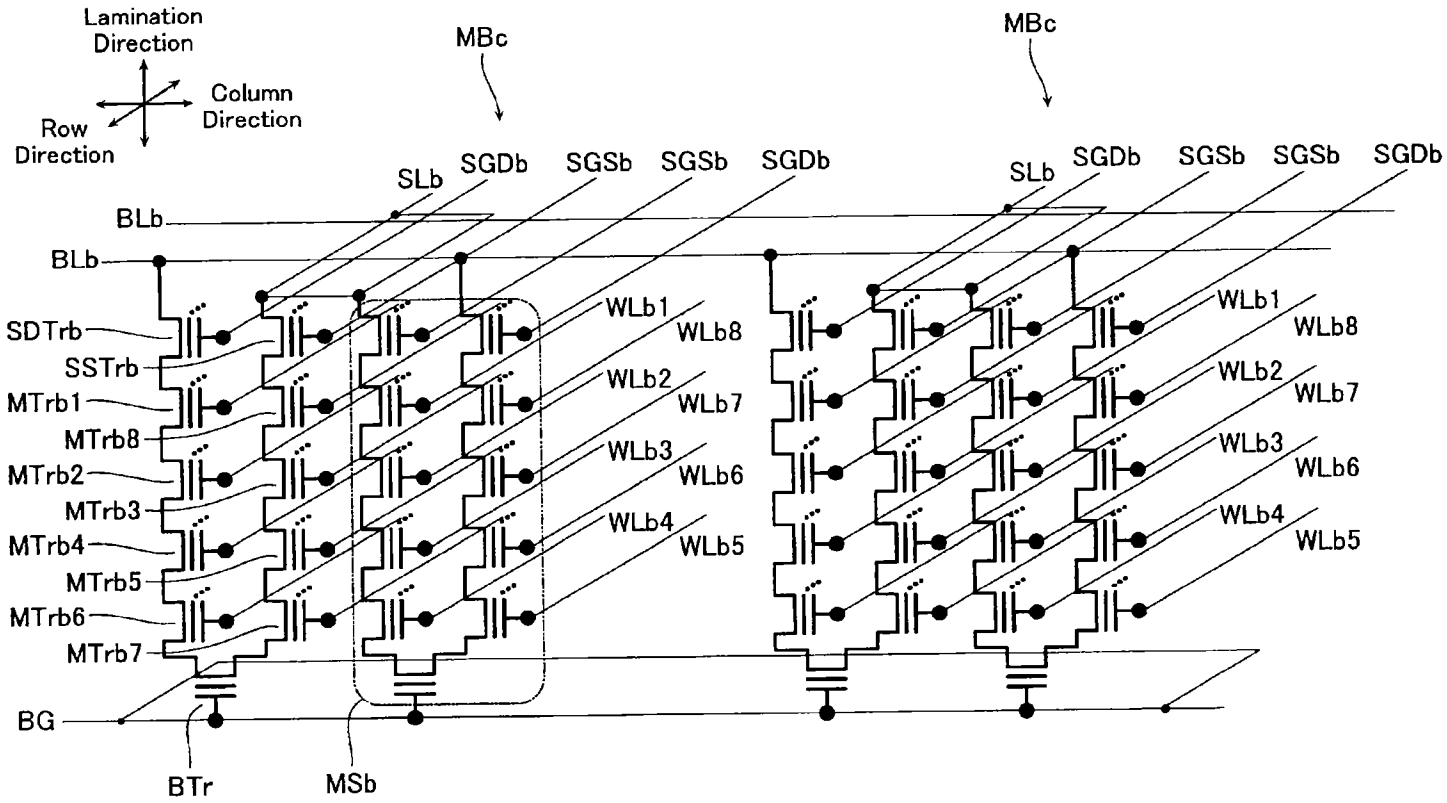
FIG. 23 is a circuit diagram of memory blocks MBc in a non-volatile semiconductor storage device according to a fourth embodiment.
Figure 24:
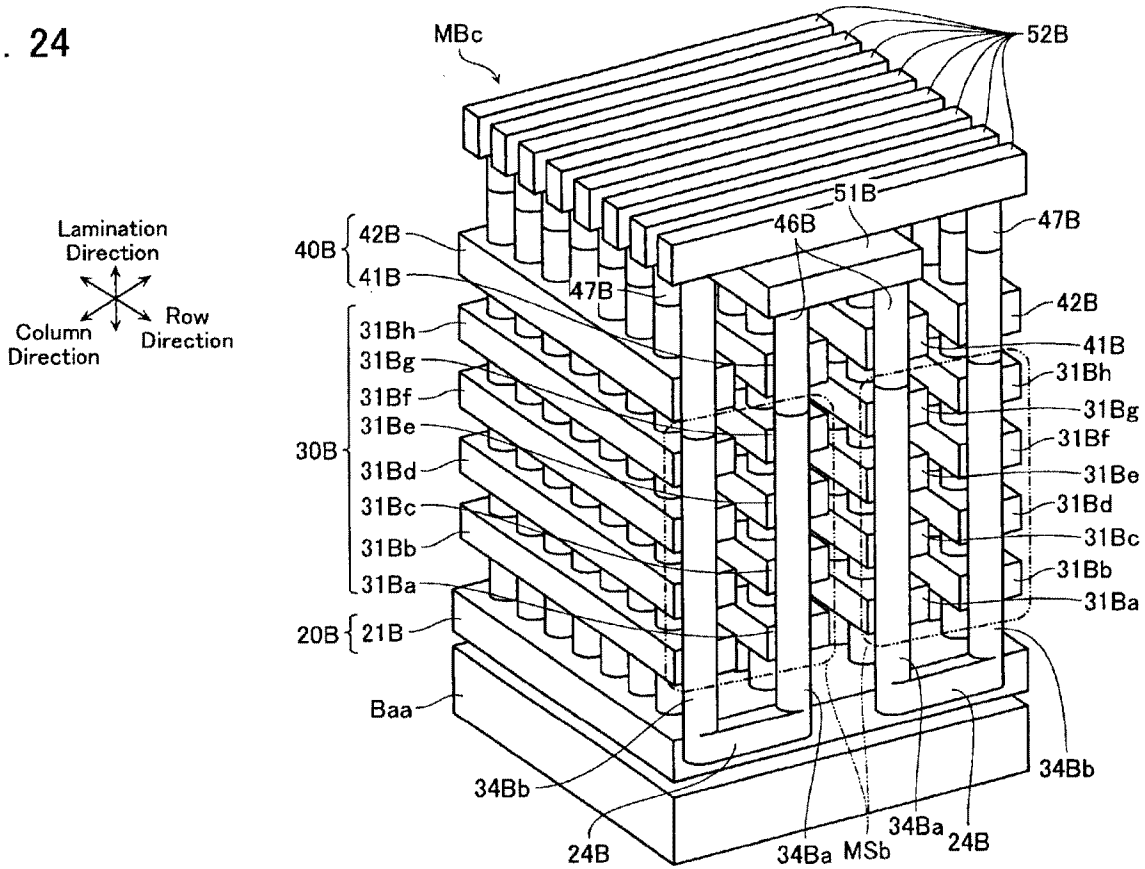
FIG. 24 is a schematic perspective view of one memory block MBc in the non-volatile semiconductor storage device of the fourth embodiment.
Figure 25:
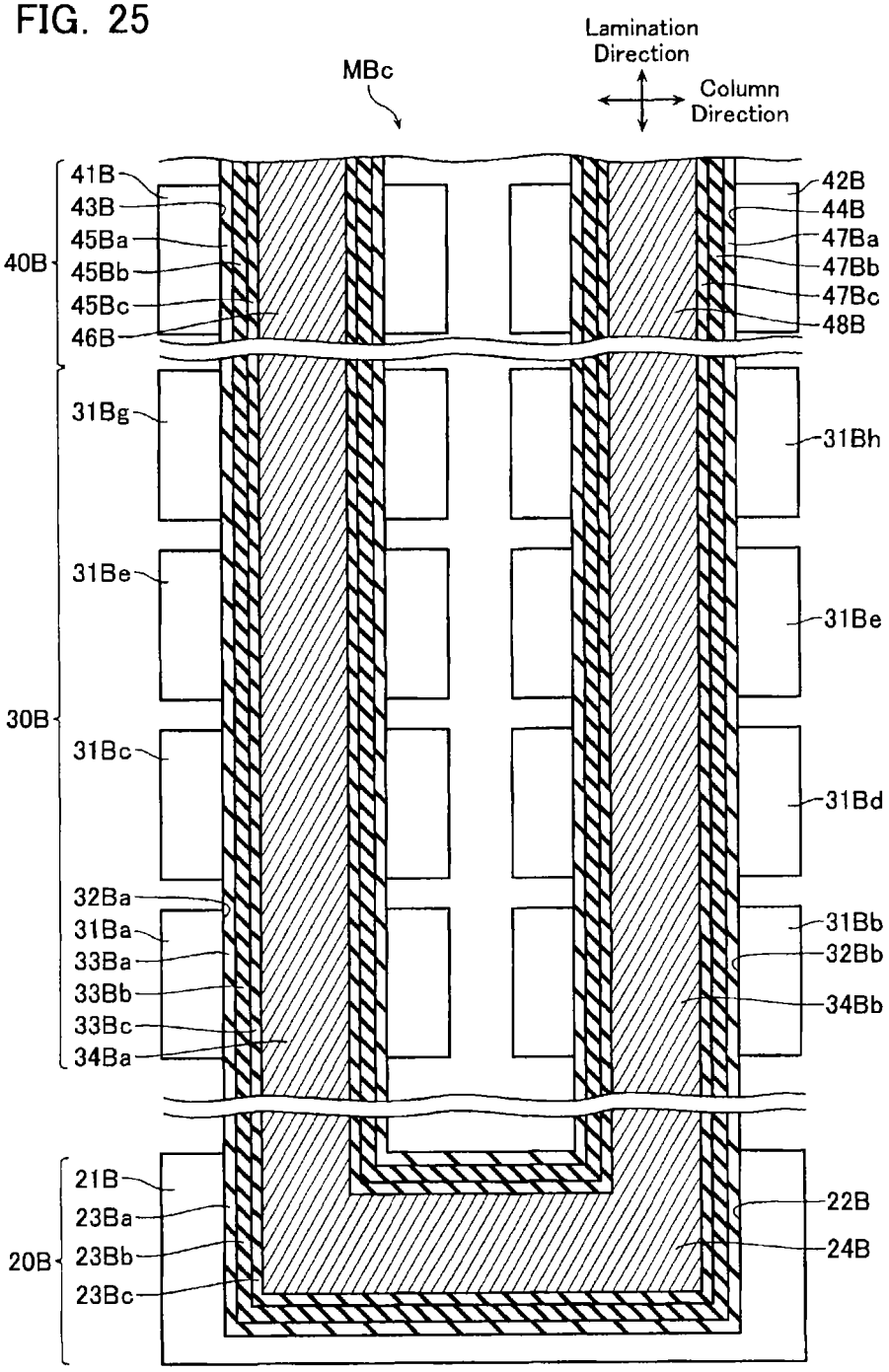
FIG. 25 is an enlarged cross-sectional view of a part of FIG. 24.

Referring now to FIGS. 23 to 25, a configuration of a non-volatile semiconductor storage device according to a fourth embodiment will be described below. FIG. 23 is a circuit diagram of memory blocks MBc in the non-volatile semiconductor storage device of the fourth embodiment. FIG. 24 is a schematic perspective view of one memory block MBc. FIG. 25 is an enlarged cross-sectional view illustrating a part of FIG. 24. Note that the same reference numerals represent the same components as the first to third embodiments, and description thereof will be omitted in the fourth embodiment.

As illustrated in FIG. 23, each memory block MBc comprises a plurality of memory strings MSb, source-side selection transistors SSTrb, and drain-side selection transistors SDTrb. Each memory string MSb includes memory transistors MTrb1 to MTrb8 connected in series and a back gate transistor BTr. Each back gate transistor BTr is connected between a memory transistor MTrb4 and a memory transistor MTrb5. Each drain-side selection transistor SDTrb is connected to one end (a memory transistor MTrb8) of a memory string MSb. Each source-side selection transistor SSTrb is connected to the other end (a memory transistor MTrb1) of a memory string MSb.

As illustrated in FIG. 23, in each memory block MBc, the control gates of the memory transistors MTrb1 arranged in the row direction are commonly connected to a word line WLb1. Similarly, the control gates of the memory transistors MTrb2 to MTrb8 arranged in the row direction are commonly connected to respective word lines WLb2 to WLb8. In addition, the control gates of the back gate transistors BTr arranged in a matrix form in the row and column directions are commonly connected to a back gate line BG.

As illustrated in FIG. 23, in each memory block MBc, the control gates of the respective drain-side selection transistors SDTrb arranged in the column direction are commonly connected to a drain-side selection gate line SGDb. Each drain-side selection gate line SGDb is formed to extend in the row direction across a plurality of memory blocks MBb. In addition, the other ends of the drain-side selection transistors SDTrb arranged in the row direction are commonly connected to a bit line BLb. Each bit line BLb is formed to extend in the column direction across a plurality of memory blocks MBb.

As illustrated in FIG. 23, in each memory block MBc, the control gates of the respective source-side selection transistors SSTrb arranged in the column direction are commonly connected to a source-side selection gate line SGSb. Each source-side selection gate line SGSb is formed to extend in the row direction across a plurality of memory blocks MBc. In addition, the other ends of the source-side selection transistors SSTrb arranged in the row direction are commonly connected to a source line SLb. The neighboring source-side selection transistors SSTrb in the column direction are connected to a common source line SLb. Each source line SLb is formed to extend in the row direction across a plurality of memory blocks MBc.

The circuit configuration of the memory blocks MBc as described above is achieved by the lamination structure illustrated in FIGS. 24 and 25. Each memory block MBc has a back gate transistor layer 20B, a memory transistor layer 30B, and a selection transistor layer 40B that are sequentially laminated on a semiconductor substrate Baa. The back gate transistor layer 20B functions as back gate transistors BTr. The memory transistor layer 30B functions as memory strings MSb (memory transistors MTrb1 to MTrb8). The selection transistor layer 40B functions as source-side selection transistors SSTrb and drain-side selection transistors SDTrb.

As illustrated in FIGS. 24 and 25, the back gate transistor layer 20B has a back gate conductive layer 21B. The back gate conductive layer 21B is formed over a certain region so as to expand in the row and column directions. The back gate conductive layer 21B is separated for each memory block MBc.

Each back gate conductive layer 21B is composed of, e.g., polysilicon (p-Si).

As illustrated in FIG. 25, the back gate transistor layer 20B also has a back gate hole 22B that is formed to dig into the back gate conductive layer 21B. Each back gate hole 22B is formed to extend in the column direction. The back gate holes 22B are formed in a matrix form in the row and column directions.

Furthermore, as illustrated in FIG. 25, the back gate transistor layer 20B has a block insulation layer 23Ba, an electric charge storage layer 23Bb, a tunnel insulation layer 23Bc, and a bottom semiconductor layer 24B within each back gate hole 22B. Each block insulation layer 23Ba is formed with a certain thickness on the sidewall of a back gate hole 22B. Each electric charge storage layer 23Bb is formed with a certain thickness on the sidewall of a block insulation layer 23Ba. Each tunnel insulation layer 23Bc is formed with a certain thickness on the sidewall of an electric charge storage layer 23Bb. Each bottom semiconductor layer 24B is formed to fill up a back gate hole 22B. Each bottom semiconductor layer 24B is formed to extend in the column direction.

The block insulation layers 23Ba and the tunnel insulation layers 23Bc are composed of, e.g., silicon oxide ($SiO_2$). The electric charge storage layers 23Bb are composed of, e.g., silicon nitride (SiN). The bottom semiconductor layers 24B are composed of, e.g., polysilicon (p-Si).

In the configuration of the back gate transistor layer 20B as mentioned above, each back gate conductive layer 21B functions as the control gate of a back gate transistor BTr. In addition, each back gate conductive layer 21B functions as a part of a back gate line BG.

As illustrated in FIGS. 24 and 25, the memory transistor layer 30B has word-line conductive layers 31Ba to 31Bh. The word-line conductive layers 31Ba to 31Bh are formed to extend in the row direction. The word-line conductive layers 31Ba to 31Bh are insulated and isolated from each other via interlayer insulation layers (not illustrated). The word-line conductive layers 31Ba to 31Bh are separated for each memory block MBc. The word-line conductive layer 31Ba and the word-line conductive layer 31Bb are formed on the first (bottom) layer. The word-line conductive layer 31Bc and the word-line conductive layer 31Bd are formed on the second layer. The word-line conductive layer 31Be and the word-line conductive layer 31Bf are formed on the third layer. The word-line conductive layer 31Bg and the word-line conductive layer 31Bh are formed on the fourth (top) layer.

The word-line conductive layers 31Ba to 31Bh are composed of, e.g., polysilicon (p-Si).

As illustrated in FIG. 25, the memory transistor layer 30B also has a memory hole 32Ba that is formed to penetrate the word-line conductive layers 31Ba, 31Bc, 31Be, and 31Bg, and a memory hole 32Bb that is formed to penetrate the word-line conductive layers 31Bb, 31Bd, 31Bf, and 31Bh. The memory holes 32Ba and 32Bb are formed in a matrix form in the row and column directions. The memory holes 32Ba and 32Bb are formed to match opposite ends in the column direction of the respective back gate holes 22B.

Furthermore, as illustrated in FIG. 25, the memory transistor layer 30B has a block insulation layer 33Ba, an electric charge storage layer 33Bb, a tunnel insulation layer 33Bc, and memory columnar semiconductor layers 34Ba and 34Bb within respective memory holes 32Ba and 32Bb. Each block insulation layer 33Ba is formed with a certain thickness on the sidewall of a memory hole 32B. Each electric charge storage layer 33Bb is formed with a certain thickness on the sidewall of a block insulation layer 33Ba. Each tunnel insulation layer 33Bc is formed with a certain thickness on the sidewall of an electric charge storage layer 33Bb. The memory columnar semiconductor layers 34Ba and 34Bb are formed to fill up respective memory holes 32Ba and 32Bb. Each of the memory columnar semiconductor layers 34Ba and 34Bb is formed in a columnar shape extending in the lamination direction. The memory columnar semiconductor layers 34Ba and 34Bb are formed in contact with the top surface of a bottom semiconductor layer 24B at opposite ends in the column direction. That is, each semiconductor layer included in a memory string MSb includes a pair of memory columnar semiconductor layers 34Ba and 34Bb (columnar portions) and a bottom semiconductor layer 24B (a joining portion) that is formed to join the bottom ends of the memory columnar semiconductor layers 34Ba and 34Bb. Each semiconductor layer included in a memory string MSb is formed in a U-shape as viewed from the row direction.

The block insulation layers 33Ba and the tunnel insulation layers 33Bc are composed of, e.g., silicon oxide ($SiO_2$). The electric charge storage layers 33Bb are composed of, e.g., silicon nitride (SiN). The memory columnar semiconductor layers 34B are composed of, e.g., polysilicon (p-Si).

In the configuration of the memory transistor layer 30B as mentioned above, the word-line conductive layers 31Ba to 31Bh function as the control gates of the memory transistors MTrb1 to MTrb8. In addition, the word-line conductive layers 31Ba to 31Bh function as parts of the word lines WLb1 to WLb8.

As illustrated in FIGS. 24 and 25, the selection transistor layer 40B has a source-side conductive layer 41B and a drain-side conductive layer 42B. Each source-side conductive layer 41B and drain-side conductive layer 42B are formed to extend in the row direction. Each source-side conductive layer 41B is formed above the top word-line conductive layer 31Bg. Each drain-side conductive layer 42B is formed above the top word-line conductive layer 31Bh.

The source-side conductive layers 41B and the drain-side conductive layers 42B are composed of, e.g., polysilicon (p-Si).

As illustrated in FIG. 25, the selection transistor layer 40B also has a source-side hole 43B that is formed to penetrate a source-side conductive layer 41B, and a drain-side hole 44B that is formed to penetrate a drain-side conductive layer 42B. Each source-side hole 43B is formed at a position matching a respective memory hole 32Ba. Each drain-side hole 44B is formed at a position matching respective a memory hole 32Bb.

Furthermore, as illustrated in FIG. 25, the selection transistor layer 40B has a block insulation layer 45Ba, an electric charge storage layer 45Bb, a tunnel insulation layer 45Bc, and a source-side columnar semiconductor layer 46B within each source-side hole 43B. Each block insulation layer 45Ba is formed with a certain thickness on the sidewall of a source-side hole 43B. Each electric charge storage layer 45Bb is formed with a certain thickness on the sidewall of a block insulation layer 45Ba. Each tunnel insulation layer 45Bc is formed with a certain thickness on the sidewall of an electric charge storage layer 45Bb. Each source-side columnar semiconductor layer 46B is formed to fill up a source-side hole 43B. The source-side columnar semiconductor layers 46B are formed in a matrix form in the row and column directions. Each source-side columnar semiconductor layer 46B is formed in a columnar shape extending in the lamination direction. Each source-side columnar semiconductor layer 46B is formed in contact with the top surface of the corresponding memory columnar semiconductor layer 34Ba.

The block insulation layers 45Ba and the tunnel insulation layers 45Bc are composed of, e.g., silicon oxide ($SiO_2$). The electric charge storage layers 45Bb are composed of, e.g., silicon nitride (SiN). The source-side columnar semiconductor layers 46B are composed of, e.g., polysilicon (p-Si).

Furthermore, as illustrated in FIG. 25, the selection transistor layer 40B has a block insulation layer 47Ba, an electric charge storage layer 47Bb, a tunnel insulation layer 47Bc, and a drain-side columnar semiconductor layer 48B within each drain-side hole 44B. Each block insulation layer 47Ba is formed with a certain thickness on the sidewall of a drain-side hole 44B. Each electric charge storage layer 47Bb is formed with a certain thickness on the sidewall of a block insulation layer 47Ba. Each tunnel insulation layer 47Bc is formed with a certain thickness on the sidewall of an electric charge storage layer 47Bb. Each drain-side columnar semiconductor layer 48B is formed to fill up a drain-side hole 44B. The drain-side columnar semiconductor layers 48B are formed in a matrix form in the row and column directions. Each drain-side columnar semiconductor layer 48B is formed in a columnar shape extending in the lamination direction. Each drain-side columnar semiconductor layer 48B is formed in contact with the top surface of the corresponding memory columnar semiconductor layer 34Bb.

The block insulation layers 47Ba and the tunnel insulation layers 47Bc are composed of, e.g., silicon oxide ($SiO_2$). The electric charge storage layers 47Bb are composed of, e.g., silicon nitride (SiN). The drain-side columnar semiconductor layers 48B are composed of, e.g., polysilicon (p-Si).

In the configuration of the selection transistor layer 40B as mentioned above, each source-side conductive layer 41B functions as the control gate of a source-side selection transistor SSTrb. In addition, each source-side conductive layer 41B functions as a part of a source-side selection gate line SGSb. Each drain-side conductive layer 42B functions as the control gate of a drain-side selection transistor SDTrb. Each drain-side conductive layer 42B also functions as a part of a drain-side selection gate line SGDb.

In addition, as illustrated in FIG. 24, a source-line conductive layer 51B is formed on the top surfaces of the source-side columnar semiconductor layers 46B aligned in the row direction. Each source-line conductive layer 51B is formed to extend in the row direction. Each source-line conductive layer 51B functions as a source line SLb. In addition, bit-line conductive layers 52B are formed on the top surfaces of the drain-side columnar semiconductor layers 48B aligned in the row direction. Each bit-line conductive layer 52B is formed to extend in the column direction. Each bit-line conductive layer 52B functions as a bit line BLb.

Operation of Non-Volatile Semiconductor Device in Fourth Embodiment

An operation of the non-volatile semiconductor device according to the fourth embodiment will now be described below. As in the third embodiment, prior to a read operation, the control signal generation unit 16 according to the fourth embodiment performs pre-programming on the control gates of an unselected drain-side selection transistor SDTrb (n-sel) and an unselected source-side selection transistor SSTrb (n-sel) that are connected to an unselected memory string MSb. As a result, it increases the threshold voltages of these control gates.

In addition, as in the third embodiment, after the read operation, the control signal generation unit 16 of the fourth embodiment erases the pre-programming of the control gates of the unselected drain-side selection transistor SDTrb (n-sel) and the unselected source-side selection transistor SSTrb (n-sel). As a result, it decreases the threshold voltages of these control gates.

Advantages of Non-Volatile Semiconductor Device in Fourth Embodiment

Advantages of the non-volatile semiconductor device according to the fourth embodiment will be described below. The non-volatile semiconductor storage device of the fourth embodiment operates in the same way as described in the third embodiment. Accordingly, the non-volatile semiconductor storage device of the fourth embodiment has the same advantages as the third embodiment.

Other Embodiments

While embodiments of the non-volatile semiconductor storage device have been described, the present invention is not intended to be limited to the disclosed embodiments and various other changes, additions, substitutions or the like may be made thereto without departing from the spirit of the invention.

For example, the non-volatile semiconductor storage device of the fourth embodiment may be configured to perform pre-programming only on unselected drain-side selection transistors SDTrb (n-sel) that are connected to a selected memory string MSb (sel). The non-volatile semiconductor storage device of the fourth embodiment may also be configured to perform pre-programming only on unselected source-side selection transistors SSTrb (n-sel) that are connected to a selected memory string MS (sel).

What is claimed is:

[1. A non-volatile semiconductor storage device comprising:

a plurality of memory strings, each having a plurality of electrically rewritable memory cells connected in series; and a plurality of first selection transistors connected to one ends of the respective memory strings, each of the memory strings comprising:

a first semiconductor layer including a columnar portion extending in a direction perpendicular to a substrate;

a first electric charge storage layer formed to surround a side surface of the columnar portion; and a first conductive layer formed to surround a side surface of the columnar portion as well as the first electric charge storage layer, the first conductive layer functioning as a control electrode of a respective one of the memory cells, each of the first selection transistors comprising:

a second semiconductor layer extending upward from a top surface of the columnar portion;

a second electric charge storage layer formed to surround a side surface of the second semiconductor layer; and a second conductive layer formed to surround a side surface of the second semiconductor layer as well as the second electric charge storage layer, the second conductive layer functioning as a control electrode of a respective one of the first selection transistors, the non-volatile semiconductor storage device further comprising a control circuit configured to cause, prior to reading data from a selected one of the memory strings, electric charges to be accumulated in the second electric charge storage layer of one of the first selection transistors connected to an unselected one of the memory strings.]

[2. The non-volatile semiconductor storage device according to claim 1, wherein a plurality of memory blocks each includes a plurality of the memory strings arranged in a matrix form, and prior to reading data from a selected one of the memory strings in a selected one of the memory blocks, the control circuit causes electric charges to be accumulated in the second electric charge storage layer of one of the first selection transistors connected to an unselected one of the memory strings in the selected memory block.]

[3. The non-volatile semiconductor storage device according to claim 1, wherein a plurality of memory blocks each includes a plurality of the memory strings arranged in a matrix form, and prior to reading data from a selected one of the memory strings in a selected one of the memory blocks, the control circuit causes electric charges to be accumulated in the second electric charge storage layers of the first selection transistors connected to the memory strings in an unselected one of the memory blocks.]

[4. The non-volatile semiconductor storage device according to claim 1, wherein a plurality of memory blocks each includes a plurality of the memory strings arranged in a matrix form, and prior to reading data from a selected one of the memory strings in a selected one of the memory blocks, the control circuit causes electric charges to be accumulated in the second electric charge storage layer of one of the first selection transistors connected to an unselected one of the memory strings in the selected memory block, and also causes electric charges to be accumulated in the second electric charge storage layers of the first selection transistors connected to the memory strings in an unselected one of the memory blocks.]

[5. The non-volatile semiconductor storage device according to claim 1, wherein after reading data from a selected one of the memory strings, the control circuit causes electric charges to be discharged from the second electric charge storage layer of one of the first selection transistors connected to an unselected one of the memory strings.]

[6. The non-volatile semiconductor storage device according to claim 5, wherein the control circuit is configured to generate a GIDL current near a gate of one of the first selection transistors connected to an unselected one of the memory strings to boost a voltage at the second semiconductor layer to a first voltage by the GIDL current, thereby discharging electric charges stored in the second electric charge storage layer.]

[7. The non-volatile semiconductor storage device according to claim 1, wherein the control circuit causes electric charges to be accumulated in the second electric charge storage layer by boosting in a step-like manner to be applied to a gate of one of the first selection transistors connected to an unselected one of the memory strings.]

[8. The non-volatile semiconductor storage device according to claim 1, comprising:

a plurality of second selection transistors connected to the other ends of the memory strings, wherein each of the second selection transistors comprises:

a third semiconductor layer extending downward from a bottom surface of the first semiconductor layer;

a third electric charge storage layer formed to surround a side surface of the third semiconductor layer; and a third conductive layer formed to surround a side surface of the third semiconductor layer as well as the third electric charge storage layer, the third conductive layer functioning as a control electrode of a respective one of the second selection transistors, and prior to reading data from a selected one of the memory strings, the control circuit causes electric charges to be accumulated in the third electric charge storage layer of one of the second selection transistors connected to an unselected one of the memory strings.]

[9. The non-volatile semiconductor storage device according to claim 8, wherein a plurality of memory blocks each includes a plurality of the memory strings arranged in a matrix form, and prior to reading data from a selected one of the memory strings in a selected one of the memory blocks, the control circuit causes electric charges to be accumulated in the third electric charge storage layer of one of the second selection transistors connected to an unselected one of the memory strings in the selected memory block.]

[10. The non-volatile semiconductor storage device according to claim 8, wherein a plurality of memory blocks each includes a plurality of the memory strings arranged in a matrix form, and prior to reading data from a selected one of the memory strings in a selected one of the memory blocks, the control circuit causes electric charges to be accumulated in the third electric charge storage layers of the second selection transistors connected to the memory strings in an unselected one of the memory blocks.]

[11. The non-volatile semiconductor storage device according to claim 8, wherein a plurality of memory blocks each includes a plurality of the memory strings arranged in a matrix form, and prior to reading data from a selected one of the memory strings in a selected one of the memory blocks, the control circuit causes electric charges to be accumulated in the third electric charge storage layer of one of the second selection transistors connected to an unselected one of the memory strings in the selected memory block, and also causes electric charges to be accumulated in the third electric charge storage layers of the second selection transistors connected to the memory strings in an unselected one of the memory blocks.]

[12. The non-volatile semiconductor storage device according to claim 8, wherein after reading data from a selected one of the memory strings, the control circuit causes electric charges to be discharged from the third electric charge storage layer of one of the second selection transistors connected to an unselected one of the memory strings.]

[13. The non-volatile semiconductor storage device according to claim 12, wherein the control circuit is configured to generate a GIDL current near a gate of one of the second selection transistors connected to an unselected one of the memory strings to boost a voltage at the third semiconductor layer to a second voltage by the GIDL current, thereby discharging electric charges stored in the third electric charge storage layer.]

[14. The non-volatile semiconductor storage device according to claim 8, wherein the control circuit causes electric charges to be accumulated in the third electric charge storage layer by boosting in a step-like manner a voltage to be applied to a gate of one of the second selection transistors connected to an unselected one of the memory strings.]

[15. The non-volatile semiconductor storage device according to claim 1, wherein the first semiconductor layer comprises a joining portion formed to join bottom ends of a pair of the columnar portions.]

[16. A non-volatile semiconductor storage device comprising:

a plurality of memory strings, each having a plurality of electrically rewritable memory cells connected in series; and a plurality of first selection transistors connected to one ends of the respective memory strings, each of the memory strings comprising:

a first semiconductor layer including a columnar portion extending in a direction perpendicular to a substrate;

a first electric charge storage layer formed to surround a side surface of the columnar portion; and a first conductive layer formed to surround a side surface of the columnar portion as well as the first electric charge storage layer, the first conductive layer functioning as a control electrode of a respective one of the memory cells, each of the first selection transistors comprising:

a second semiconductor layer extending downward from a bottom surface of the columnar portion;

a second electric charge storage layer formed to surround a side surface of the second semiconductor layer; and a second conductive layer formed to surround a side surface of the second semiconductor layer as well as the second electric charge storage layer, the second conductive layer functioning as a control electrode of a respective one of the first selection transistors, the non-volatile semiconductor storage device further comprising a control circuit configured to cause, prior to reading data from a selected one of the memory strings, electric charges to be accumulated in the second electric charge storage layer of one of the first selection transistors connected to an unselected one of the memory strings.]

[17. The non-volatile semiconductor storage device according to claim 16, wherein a plurality of memory blocks each includes a plurality of the memory strings arranged in a matrix form, and prior to reading data from a selected one of the memory strings in a selected one of the memory blocks, the control circuit causes electric charges to be accumulated in the second electric charge storage layer of one of the first selection transistors connected to an unselected one of the memory strings in the selected memory block.]

[18. The non-volatile semiconductor storage device according to claim 16, wherein a plurality of memory blocks each includes a plurality of the memory strings arranged in a matrix form, and prior to reading data from a selected one of the memory strings in a selected one of the memory blocks, the control circuit causes electric charges to be accumulated in the second electric charge storage layers of the first selection transistors connected to the memory strings in an unselected one of the memory blocks.]

[19. The non-volatile semiconductor storage device according to claim 16, wherein a plurality of memory blocks each includes a plurality of the memory strings arranged in a matrix form, and prior to reading data from a selected one of the memory strings in a selected one of the memory blocks, the control circuit causes electric charges to be accumulated in the second electric charge storage layer of one of the first selection transistors connected to an unselected one of the memory strings in the selected memory block, and also causes electric charges to be accumulated in the second electric charge storage layers of the first selection transistors connected to the memory strings in an unselected one of the memory blocks.]

[20. The non-volatile semiconductor storage device according to claim 16, wherein after reading data from a selected one of the memory strings, the control circuit causes electric charges to be discharged from the second electric charge storage layer of one of the first selection transistors connected to an unselected one of the memory strings.]

*21. A non-volatile semiconductor storage device comprising:*

*a plurality of memory strings including a plurality of memory cells, the memory strings including a first memory string and a second memory string,*

*a first selection transistor coupled to one end of the first memory string and a bit line;*

*a second selection transistor coupled to one end of the second memory string and the bit line;*

*a word line coupled to a gate of one of the memory cells in the first memory string and a gate of one of the memory cells in the second memory string;*

*a first line coupled to a gate of the first selection transistor;*

*a second line coupled to a gate of the second selection transistor; and*

*a controller configured to perform a pre-program operation and a program operation, the pre-program operation including a first phase and the program operation including a second phase,*

*the controller configured to apply a first program voltage to the first line, a first voltage to the second line, and a second voltage to the word line during the first phase, and the controller configured to apply a third voltage to the first line, a fourth voltage to the second line, and a second program voltage to the word line during the second phase;*

*wherein the first program voltage and the second program voltage are higher than the first voltage, the second voltage, the third voltage, and the fourth voltage.*

*22. The non-volatile semiconductor storage device according to claim 21 wherein the controller is configured to program one of the memory cells in the program operation.*

*23. The non-volatile semiconductor storage device according to claim 21 wherein the first, second, and fourth voltages are zero voltages and the first program voltage is substantially same as the second program voltage.*

*24. The non-volatile semiconductor storage device according to claim 21 wherein the program operation includes a third phase before the second phase;*

*the controller further configured to apply a fifth voltage to the first line and apply a sixth voltage to the word line, the fifth voltage being substantially same as the sixth voltage, in the third phase.*

*25. The non-volatile semiconductor storage device according to claim 24 wherein the fifth voltage is higher than zero voltage and lower than the first program voltage and the second program voltage.*

*26. The non-volatile semiconductor storage device according to claim 21 wherein the controller is configured to perform a pre-program erase operation including a fourth phase;*

*the controller further configured to apply a seventh voltage to the first line and set the word line in a floating state during the fourth phase, wherein the seventh voltage is lower than the first program voltage and the second program voltage and the seventh voltage is higher than the first voltage, the second voltage, the third voltage, and the fourth voltage.*

*27. The non-volatile semiconductor storage device according to claim 26 wherein the controller is configured to perform the pre-program operation, a read operation, and the pre-program erase operation in this order.*

*28. A non-volatile semiconductor storage device comprising:*

*a plurality of memory strings including a plurality of memory cells, the memory strings including a first memory string and a second memory string,*

*a first selection transistor coupled to one end of the first memory string and a source line;*

*a second selection transistor coupled to one end of the second memory string and the source line;*

*a word line electrically coupled to a gate of one of the memory cells in the first memory string and a gate of one of the memory cells in the second memory string;*

*a first line coupled to a gate of the first selection transistor;*

*a second line coupled to a gate of the second selection transistor; and*

*a controller configured to perform a pre-program operation and a program operation, the pre-program operation including a first phase and the program operation including a second phase,*

*the controller configured to apply a first program voltage to the first line, a first voltage to the second line, and a second voltage to the word line during the first phase, and*

*the controller configured to apply a third voltage to the first line and a fourth voltage to the second line and a second program voltage to the word line during the second phase,*

*wherein the first program voltage and the second program voltage are higher than the first voltage, the second voltage, the third voltage, and the fourth voltage.*

*29. The non-volatile semiconductor storage device according to claim 28 wherein the first, second, and fourth voltages are zero voltages and the first program voltage is substantially same as the second program voltage.*

*30. The non-volatile semiconductor storage device according to claim 28 wherein the program operation includes a third phase;*

*the controller further configured to apply a fifth voltage to the first line and apply a sixth voltage to the word line, the fifth voltage being higher than the sixth voltage, and the fifth voltage being higher than the third voltage, in the third phase after the second phase.*

*31. The non-volatile semiconductor storage device according to claim 30 wherein the fifth voltage is higher than zero voltage and lower than the first program voltage and the second program voltage.*

*32. The non-volatile semiconductor storage device according to claim 28 wherein the controller is further configured to perform the pre-program operation before a read operation.*

*33. The non-volatile semiconductor storage device according to claim 32 wherein the controller is further configured to perform a pre-program erase operation including a fourth phase; the controller further configured to apply a seventh voltage to the first line and set the word line in a floating stat during the fourth phase, wherein the seventh voltage is lower than the first program voltage and the second program voltage and the seventh voltage are higher than the first to fourth voltages.*

*34. The non-volatile semiconductor storage device according to claim 33 wherein the controller is configured to perform the pre-program operation, a read operation, and the pre-program erase operation in this order.*

* * * * *